(12) United States Patent
Xiong et al.

(10) Patent No.: US 9,231,733 B2
(45) Date of Patent: Jan. 5, 2016

(54) METHOD AND SYSTEM FOR UPDATING MULTI-FREQUENCY-BAND PRE-DISTORTION COEFFICIENT LOOKUP TABLE

(71) Applicant: DATANG MOBILE COMMUNICATIONS EQUIPMENT CO., LTD, Beijing (CN)

(72) Inventors: Jun Xiong, Beijing (CN); Tao Duan, Beijing (CN); Huarong Sun, Beijing (CN); Peng Xiao, Beijing (CN)

(73) Assignee: DATANG MOBILE COMMUNICATIONS EQUIPMENT CO., LTD, Beijing (CN)

( * ) Notice: Subject to any disclaimer, the term of this patent is extended or adjusted under 35 U.S.C. 154(b) by 0 days.

(21) Appl. No.: 14/646,733

(22) PCT Filed: Jul. 17, 2013

(86) PCT No.: PCT/CN2013/079532
§ 371 (c)(1),
(2) Date: May 22, 2015

(87) PCT Pub. No.: WO2014/079222
PCT Pub. Date: May 30, 2014

(65) Prior Publication Data
US 2015/0304068 A1    Oct. 22, 2015

(30) Foreign Application Priority Data
Nov. 26, 2012    (CN) .......................... 2012 1 0487334

(51) Int. Cl.
*H04L 25/49*    (2006.01)
*H04L 1/00*    (2006.01)
(Continued)

(52) U.S. Cl.
CPC ............ *H04L 1/0043* (2013.01); *H04L 1/0036* (2013.01); *H04L 25/03159* (2013.01); *H04L 25/03343* (2013.01); *H04L 25/49* (2013.01); *H04L 27/2646* (2013.01)

(58) Field of Classification Search
CPC ............ H04L 23/368; H04L 25/03343; H04L 27/367; H04L 27/368; H04B 1/0475; H03F 1/3247
USPC ............. 375/95–297; 455/63.1, 67.11, 67.13, 455/114.2, 114.3
See application file for complete search history.

(56) References Cited

U.S. PATENT DOCUMENTS

| | | | | |
|---|---|---|---|---|
| 7,539,268 B2* | 5/2009 | Fechtel | .................. | H03D 3/008 375/213 |
| 8,081,710 B2* | 12/2011 | Carey | .................... | H04L 27/364 375/227 |

(Continued)

FOREIGN PATENT DOCUMENTS

| | | |
|---|---|---|
| CN | 102014090 A | 4/2011 |
| CN | 102255835 A | 11/2011 |
| CN | 103023842 A | 4/2013 |

*Primary Examiner* — Khanh C Tran
(74) *Attorney, Agent, or Firm* — Gokalp Bayramoglu

(57) ABSTRACT

Disclosed are a method and a system for updating a multi-frequency band pre-distortion coefficient lookup table, in order to solve the problems that the calculation complexity is high. Wherein, the method comprises: collecting a first frequency band reference signal and a first frequency band feedback signal, a second frequency band reference signal and a second frequency band feedback signal; calculating a first frequency band pre-distortion coefficient and a second frequency band pre-distortion coefficient; performing phase calibration on the first frequency band pre-distortion coefficient and the second frequency band pre-distortion coefficient, respectively; and updating a first lookup table according to the first frequency band pre-distortion coefficient performed the phase calibration, and updating a second lookup table according to the second frequency band pre-distortion coefficient performed the phase calibration.

18 Claims, 6 Drawing Sheets

(51) Int. Cl.
*H04L 25/03* (2006.01)
*H04L 27/26* (2006.01)

(56) References Cited

U.S. PATENT DOCUMENTS

| | | | | |
|---|---|---|---|---|
| 8,503,950 B1* | 8/2013 | Dick | H04B 1/0475 | 375/295 |
| 8,615,208 B2* | 12/2013 | McCallister | H03F 1/0266 | 375/297 |
| 8,867,413 B2* | 10/2014 | Phan Huy | H04L 5/14 | 370/278 |
| 2004/0179629 A1* | 9/2004 | Song | H03F 1/3247 | 375/296 |
| 2010/0254299 A1* | 10/2010 | Kenington | H01Q 3/267 | 370/315 |
| 2012/0202440 A1* | 8/2012 | Fudaba | H03F 1/3247 | 455/114.2 |
| 2012/0321018 A1 | 12/2012 | Chen et al. | | |
| 2013/0058435 A1* | 3/2013 | Matsuura | H04L 27/367 | 375/297 |
| 2015/0214904 A1* | 7/2015 | Lozhkin | H03F 1/3247 | 330/75 |

* cited by examiner

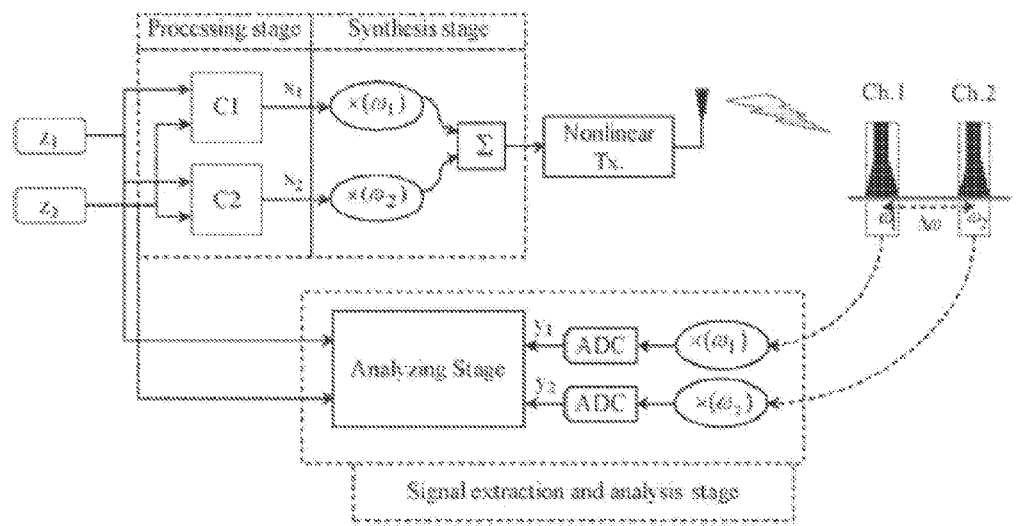

Fig. 1

- collecting a first frequency band reference signal and a first frequency band feedback signal, and a second frequency band reference signal and a second frequency band feedback signal — 200

- calculating a first frequency band pre-distortion coefficient and a second frequency band pre-distortion coefficient, according to the first frequency band reference signal and the first frequency band feedback signal, and the second frequency band reference signal and the second frequency band feedback signal — 202

- performing phase calibration on the first frequency band pre-distortion coefficient and the second frequency band pre-distortion coefficient, respectively — 204

- updating a first lookup table according to the first frequency band pre-distortion coefficient performed the phase calibration, and updating a second lookup table according to the second frequency band pre-distortion coefficient performed the phase calibration — 206

Fig. 2

METHOD AND SYSTEM FOR UPDATING MULTI-FREQUENCY-BAND PRE-DISTORTION COEFFICIENT LOOKUP TABLE

This present application claims the priority of Chinese Patent Application No. 201210487334.7, titled "Method and System for Updating Multi-frequency band Pre-distortion Coefficient Lookup Table", filed on Nov. 26, 2012 in the Intellectual Property Office of China, the disclosure of which is incorporated herein by reference.

TECHNICAL FIELD

The present application relates to the field of communication technologies, and particularly to a method and a system for updating multi-frequency band pre-distortion coefficient lookup table.

BACKGROUND ART

At present, with global large-scale construction of 3G network, operators increasingly focus on reducing the construction costs and the maintenance costs. Power amplifier as one of the most expensive devices in the communication system is more and more required to have a higher efficiency, such that the Digital Pre-Distortion (DPD) technology has developed quickly.

In the DPD technology, the DPD processing of signals is performed mainly by pre-distortion coefficients. The pre-distortion coefficients are substantially stored in a pre-distortion coefficient LookUp Table (LUT). In the existing DPD technology, the research on updating LUT is mainly directed to single frequency band signals and a mathematical model of the DPD processing of signals is as follows:

$$z(n) = \sum_{m=0}^{M} x(n-m) \sum_{q=1}^{Q} w_{m,q}|x(n-m)|^{(q-1)}$$
$$= \sum_{m=0}^{M} x(n-m) \cdot LUT_m(|x(n-m)|)$$
$$= \sum_{m=0}^{M} x(n-m) \cdot LUT_m(Q(r_{n,m}))$$

$$LUT_m(|x(n-m)|) = \sum_{q=1}^{Q} w_{m,q}|x(n-m)|^{(q-1)},$$

$$m = 1 \ldots M, n = 1 \ldots N$$

Wherein, $r_{n,m}=|x(n-m)|$ is an amplitude of an input signal, $Q(\bullet)$ is a quantization factor, an input address of LUT depends on a quantized amplitude $Q(r_{n,m})$ of the input signal, $w_{m,q}$ is a pre-distortion coefficient calculated by DPD adaptive filter, and after calculating the $W_{m,q}$, a pre-distortion signal may be acquired by a pre-distortion module.

However, presently there is no suitable method for updating LUT of multi-frequency baud signal. If above processing of single frequency band is used for the signals of each frequency, then the calculation complexity will be high and calculated pre-distortion coefficients will be unstable.

SUMMARY OF THE INVENTION

The technical problem to be solved according to the embodiments of the present application is to provide a method and a system for updating multi-frequency baud pre-distortion coefficient lookup table, so as to solve the problems that the calculation complexity of multi-frequency band pre-distortion coefficients is high and the calculated pre-distortion coefficients are unstable.

To solve the above problems, an embodiment of the present application discloses a method for updating multi-frequency band pre-distortion coefficient lookup table, including:

collecting a first frequency band reference signal and a first frequency band feedback signal, and a second frequency band reference signal and a second frequency band feedback signal;

calculating a first frequency band pre-distortion coefficient and a second frequency band pre-distortion coefficient, according to the first frequency band reference signal and the first frequency band feedback signal, and the second frequency band reference signal and the second frequency band feedback signal;

performing phase-calibration on the first frequency band pre-distortion coefficient and the second frequency band pre-distortion coefficient, respectively;

updating a first lookup table according to the first frequency band pre-distortion coefficient performed the phase calibration, and updating a second lookup table according to the second frequency band pre-distortion coefficient performed the phase calibration; wherein, the first lookup table is a first frequency band pre-distortion coefficient lookup table, and the second lookup table is a second frequency band pre-distortion coefficient lookup table.

Preferably, the step of calculating the first frequency band pre-distortion coefficient comprises:

calculating a first frequency band feedback matrix $U_1$, according to the first frequency band feedback signal and the second frequency band feedback signal;

acquiring a reference matrix $z_1$ corresponding to the first frequency band reference signal;

calculating a matrix $\hat{c}_1$ composed of the first frequency band pre-distortion coefficient according to the $U_1$ and the $z_1$:

$$\hat{c}_1 = (U_1^H U_1)^{-1} U_1^H z_1;$$

wherein, $\hat{c}_1 = [c_{1,1}^{(1)}, c_{2,1}^{(1)}, \ldots c_{k,m}^{(1)}, \ldots c_{K,M}^{(1)}]$, $c_{k,m}^{(1)}$ is the first frequency band pre-distortion coefficient;

the step of calculating the second frequency band pre-distortion coefficient comprises:

calculating a second frequency band feedback matrix $U_2$, according to the first frequency band feedback signal and the second frequency band feedback signal;

acquiring a reference matrix $z_2$ corresponding to the second frequency band reference signal;

calculating a matrix $\hat{c}_2$ composed of the second frequency band pre-distortion coefficient according to the $U_2$ and the $z_2$:

$$\hat{c}_2 = (U_2^H U_2)^{-1} U_2^H z_2;$$

wherein, $\hat{c}_2 = [c_{1,1}^{(2)}, c_{2,1}^{(2)}, \ldots c_{k,m}^{(2)}, \ldots c_{K,M}^{(2)}]$, $c_{k,m}^{(2)}$ the second frequency band pre-distortion coefficient, k=1, 2, K, m=1, 2, M, K is a non-linear order, and M is the depth of memory.

Preferably, the step of calculating the first frequency band feedback matrix $U_1$ according to the first frequency band feedback signal and the second frequency baud feedback signal comprises:

calculating a first frequency band feedback parameter $u_{km}^{(1)}(n)$:

$$u_{km}^{(1)}(n) = y_1(n-m)\sum_{k=0}^{K-1}\sum_{p=0,1,\ldots}^{\lceil k/2 \rceil}(|y_1(n-m)|^{k-2p}|y_2(n-m)|^{2p})$$

calculating, a transpose matrix $u_{km}^{(1)}$ of the matrix composed of $u_{km}^{(1)}(n)$:

$$u_{km}^{(1)} = [u_{km}^{(1)}(0), \ldots, u_{km}^{(1)}(N-1)]^T$$

calculating the first frequency band feedback matrix $U_1$ composed of the $u_{km}^{(1)}$:

$$U_1 = [u_{11}^{(1)}, \ldots, u_{km}^{(1)}, \ldots, u_{KM}^{(1)}]$$

wherein, $y_1(n)$ is the first frequency band feedback signal, $y_2(n)$ is the second frequency band feedback signal, $n=1, 2, N$, and N is signal length.

Preferably, the step of calculating the second frequency band feedback matrix $U_2$ according to the first frequency band feedback signal and the second frequency band feedback signal comprises:

calculating a second frequency band feedback parameter $u_{km}^{(2)}(n)$:

$$u_{km}^{(2)}(n) = y_2(n-m)\sum_{k=0}^{K-1}\sum_{p=0,1,\ldots}^{\lceil k/2 \rceil}(|y_2(n-m)|^{k-2p}|y_1(n-m)|^{2p})$$

calculating a transpose matrix $u_{km}^{(2)}$ of the matrix composed of $u_{km}^{(2)}(n)$:

$$u_{km}^{(2)} = [u_{km}^{(2)}(0), \ldots, u_{km}^{(2)}(N-1)]^T$$

calculating the second frequency band feedback matrix $U_2$ composed of $u_{km}^{(2)}$:

$$U_2 = [u_{11}^{(2)}, \ldots, u_{km}^{(2)}, \ldots, u_{KM}^{(2)}]$$

wherein, $y_1(n)$ is the first frequency band feedback signal, $y_2(n)$ is the second frequency band feedback signal, $n=1, 2, \ldots, N$ and N is signal length.

Preferably, the step of performing the phase calibration on the first frequency band pre-distortion coefficient comprises:

calculating a first frequency band phase calibration factor $\theta^{(1)}$:

$$\theta^{(1)} = \text{angle}\left(\sum_{m=1}^{M-1}\sum_{k=0}^{K-1}c_{k,m}^{(1)}\right);$$

calculating a first frequency band pre-distortion coefficient $c'_{k,m}{}^{(1)}$ after the phase calibration according to $\theta^{(1)}$:

$$c'_{k,m}{}^{(1)} = c_{k,m}{}^{(1)} \cdot \exp(-j*\theta^{(1)});$$

the step of performing the phase calibration on the second frequency band pre-distortion coefficient comprises:

calculating a second frequency baud phase calibration factor $\theta^{(2)}$:

$$\theta^{(2)} = \text{angle}\left(\sum_{m=1}^{M-1}\sum_{k=0}^{K-1}c_{k,m}^{(2)}\right);$$

calculating a second frequency band pre-distortion coefficient $c'_{k,m}{}^{(2)}$ after the phase calibration according to $\theta^{(2)}$:

$$c'_{k,m}{}^{(2)} = c_{k,m}{}^{(2)} \cdot \exp(-j*\theta^{(2)}).$$

Preferably, the step of updating a first lookup table according to the first frequency band pre-distortion coefficient performed the phase calibration, comprises:

generating a first lookup table $\text{LUT1}_m(|y_1(n-m)|, |y_2(n-m)|)$, according to the first frequency band feedback signal and the second frequency band feedback signal:

$$\text{LUT1}_m(|y_1(n-m)|,|y_2(n-m)|) = \sum_{k=0}^{K-1}c'^{(1)}_{k,m} \cdot \sum_{p=0,1,\ldots}^{k/2}(b_{k,p}|y_1(n-m)|^{k-2p}|y_2(n-m)|^{2p})$$

wherein, $b_{k,p}$ is a weighting coefficient of interaction between the first frequency band and the second frequency band, $y_1(n)$ is the first frequency band feedback signal, $y_2(n)$ is the second frequency band feedback signal, $n=1, 2, \ldots, N$, and N is signal length;

acquiring a first frequency band input signal $x_1(n)$;

calculating an amplitude $|x_1(n-m)|$ of the first frequency band input signal when the depth of memory is M;

by using the amplitude $|x_1(n-m)|$ of the first frequency band input signal as an input address, storing the first frequency band pre-distortion coefficient in the first lookup table in a from-small-to-large sequence according to the input address, to update the first lookup table.

Preferably, after generating the first lookup table according to the first frequency band feedback signal and the second frequency band feedback signal, the method further comprises:

acquiring a maximum value $mv_1$ of the first frequency band input signal and a maximum size $L_1$ of the first lookup table, and a maximum size $L_2$ of the second lookup table;

dividing the maximum value $mv_1$ by the maximum size $L_1$, and using the calculated result as a first frequency band quantization factor $\Delta_1$;

transforming the first lookup table $\text{LUT1}_m(|y_1(n-m)|, |y_2(n-m)|)$ to $\text{LUT1}'_m(l_1\Delta_1, l_2\Delta_1)$, according to the first frequency band quantization factor $\Delta_1$:

$$\text{LUT1}'_m(l_1\Delta_1, l_2\Delta_1) = \sum_{k=0}^{K-1}c'^{(1)}_{k,m} \cdot \sum_{p=0,1,\ldots}^{k/2}(b_{k,p}(l_1\Delta_1)^{k-2p}(l_2\Delta_1)^{2p});$$

wherein, $l_1=1, 2, \ldots, L_1$, and $l_2=1, 2, \ldots, L_2$;

the step of storing the first frequency band pre-distortion coefficient in the first lookup table comprises:

storing the first frequency band pre-distortion coefficient in the transformed first lookup table.

Preferably, the step of updating a second lookup table according to the second frequency band pre-distortion coefficient performed the phase calibration, comprises:

generating a second lookup table $\text{LUT2}_m(|y_2(n-m)|, |y_1(n-m)|)$ according to the first frequency band feedback signal and the second frequency band feedback signal, wherein $$\text{LUT2}_m(|y_2(n-m)|,|y_1(n-m)|) = \sum_{k=0}^{K-1}c'^{(2)}_{k,m} \cdot \sum_{p=0,1,\ldots}^{k/2}(b_{k,p}|y_2(n-m)|^{k-2p}|y_1(n-m)|^{2p})$$

wherein, $b_{k,p}$ is a weighting coefficient of interaction between the first frequency band and the second frequency band, $y_1(n)$ is the first frequency band feedback signal, $y_2(n)$ the second frequency band feedback signal, n=1, 2, ..., N, and N is signal length;

acquiring a second frequency band input signal $x_2(n)$;

calculating, an amplitude $|x_2(n-m)|$ of the second frequency band input signal when the depth of memory is M;

by using the amplitude $|x_2(n-m)|$ of the second frequency band input signal as an input address, storing the second frequency band pre-distortion coefficient in the second lookup table in a from-small-to-large sequence according to the input address, to update the second lookup table.

Preferably, after generating the second lookup table according to the first frequency band feedback signal and the second frequency band feedback signal, the method further comprises:

acquiring a max mum value rim of the second frequency band input signal and a maximum size $L_2$ of the second lookup table, and a maximum size $L_1$ of the first lookup table;

dividing the maximum value $mv_2$ by the maximum size $L_2$, and using the calculated result as a second frequency band quantization factor $\Delta_2$;

transforming the second lookup table $LUT2_m(|y_2(n-m)|, |y_1(n-m)|)$ to $LUT2'_m(l_2\Delta_2, l_1\Delta_2)$, according to the second frequency band quantization factor $\Delta_2$, wherein $$LUT2'_m(l_2\Delta_2, l_1\Delta_2) = \sum_{k=0}^{K-1} c'^{(2)}_{k,m} \cdot \sum_{p=0,1,...}^{k/2} (b_{k,p}(l_2\Delta_2)^{k-2p}(l_1\Delta_2)^{2p});$$

wherein, $l_1=1, 2, ..., L_1$, and $l_2=1, 2, ..., L_2$;

the step of storing the second frequency band pre-distortion coefficient in the second lookup table comprises:

storing the second frequency band pre-distortion coefficient in the transformed second lookup table.

Preferably, the weighting coefficient $b_{k,p}$ is a constant.

According to another aspect, the embodiment of the present application also provides a system for updating multi-frequency band pre-distortion coefficient lookup table, including:

a collection module, configured to collect a first frequency baud reference signal and a first frequency band feedback signal, and a second frequency band reference signal and a second frequency band feedback signal;

a calculation module, configured to calculate a first frequency band pre-distortion coefficient and a second frequency band pre-distortion coefficient, according to the first frequency band reference signal and the first frequency band feedback signal, and the second frequency band reference signal and the second frequency band feedback signal;

a calibration module, configured to perform phase-calibration on the first frequency band pre-distortion coefficient and the second frequency band pre-distortion coefficient, respectively;

an update module, configured to update a first lookup table according to the first frequency band pre-distortion coefficient performed the phase calibration, and update a second lookup table according to the second frequency band pre-distortion coefficient performed the phase calibration; wherein, the first lookup table is a first frequency band pre-distortion coefficient lookup table, and the second lookup table is a second frequency band pre-distortion coefficient lookup table.

Preferably, the calculation module comprises:

a first matrix calculation module, configured to calculate a first frequency band feedback matrix $U_1$, according to the first frequency band feedback signal and the second frequency band feedback signal;

a first acquisition module, configured to acquire a reference matrix z corresponding to the first frequency band reference signal;

a first coefficient calculation module, configured to calculate a matrix $\hat{c}_1$ composed of the first frequency band pre-distortion coefficient according to $U_1$ and the $z_1$:

$$\hat{c}_1 = (U_1^H U_1)^{-1} U_1^H \cdot z_1;$$

wherein, $\hat{c}_1 = [c_{1,1}^{(1)}, c_{2,1}^{(1)}, \ldots c_{k,m}^{(1)}, \ldots, c_{K,M}^{(1)}]$, $c_{k,m}^{(1)}$ is the first frequency band pre-distortion coefficient;

a second matrix calculation module, configured to calculate a second frequency band feedback matrix $U_2$, according to the first frequency band feedback signal and the second frequency band feedback signal;

a second acquisition module, configured to acquire a reference matrix $z_2$ corresponding to the second frequency band reference signal;

a second coefficient calculation module, configured to calculate a matrix $\hat{c}_2$ composed of the second frequency band pre-distortion coefficient according to $U_2$ and the $z_2$:

$$\hat{c}_2 = (U_2^H U_2)^{-1} U_2^H \cdot z_2;$$

wherein, $\hat{c}_2 = [c_{1,1}^{(2)}, c_{2,1}^{(2)}, \ldots c_{k,m}^{(2)}, \ldots c_{K,M}^{(2)}]$, $c_{k,m}^{(2)}$ is the second frequency band pre-distortion coefficient, k=1, 2, ..., K, m=1, 2, ..., M, K is a non-linear order, and M is the depth of memory.

Preferably, the first matrix calculation module comprises:

a first reference calculation sub-unit, configured to calculate a first frequency band feedback parameter $u_{km}^{(1)}(n)$:

$$u_{km}^{(1)}(n) = y_1(n-m) \sum_{k=0}^{K-1} \sum_{p=0,1,...}^{[k/2]} (|y_1(n-m)|^{k-2p} |y_2(n-m)|^{2p})$$

a first transpose matrix calculation sub-unit, configured to calculate a transpose matrix $u_{km}^{(1)}$ of the matrix composed of $u_{km}^{(1)}(n)$:

$$u_{km}^{(1)} = [u_{km}^{(1)}(0), \ldots, u_{km}^{(1)}(N-1)]^T$$

a first feedback matrix calculation sub-unit, configured to calculate a first frequency band feedback matrix $U_1$ composed of $u_{km}^{(1)}$:

$$U_1 = [u_{11}^{(1)}, \ldots, u_{km}^{(1)}, \ldots, u_{KM}^{(1)}]$$

wherein, $y_1(n)$ is the first frequency band feedback signal, $y_2(n)$ is the second frequency band feedback signal, n=1, 2, ..., N, and N is signal length:

the second matrix calculation module comprises:

a second reference calculation sub-unit, configured to calculate a second frequency band feedback parameter $u_{km}^{(2)}(n)$:

$$u_{km}^{(2)}(n) = y_2(n-m) \sum_{k=0}^{K-1} \sum_{p=0,1,...}^{[k/2]} (|y_2(n-m)|^{k-2p} |y_1(n-m)|^{2p})$$

a second transpose matrix calculation sub-unit, configured to calculate a transpose matrix $u_{km}^{(2)}$ of the matrix composed of $u_{km}^{(2)}(n)$:

$$u_{km}^{(2)} = [u_{km}^{(2)}(0), \ldots, u_{km}^{(2)}(N-1)]^T$$

a second feedback matrix calculation sub-unit, configured to calculate the second frequency band feedback matrix $U_2$ composed of $u_{km}^{(2)}$:

$$U_2 = [u_{11}^{(2)}, \ldots, u_{km}^{(2)}, \ldots, u_{KM}^{(2)}]$$

wherein, $y_1(n)$ is the first frequency band feedback signal, $y_2(n)$ is the second frequency band feedback signal, $n=1, 2, \ldots, N$, and N is signal length.

Preferably, the calibration module comprises:

a first calibration factor calculation module, configured to calculate a first frequency band phase calibration factor $\theta^{(1)}$:

$$\theta^{(1)} = \text{angle}\left(\sum_{m=1}^{M-1}\sum_{k=0}^{K-1} c_{k,m}^{(1)}\right);$$

a first calibration module, configured to calculate the a first frequency band pre-distortion coefficient $c'_{k,m}^{(1)}$ after the phase calibration according to $\theta^{(1)}$:

$$c'_{k,m}^{(1)} = c_{k,m}^{(1)} \cdot \exp(-j*\theta^{(1)});$$

a second calibration factor calculation module, configured to calculate a second frequency baud phase calibration factor $\theta^{(2)}$:

$$\theta^{(2)} = \text{angle}\left(\sum_{m=1}^{M-1}\sum_{k=0}^{K-1} c_{k,m}^{(2)}\right);$$

a second calibration module, configured to calculate a second frequency band pre-distortion coefficient $c'_{k,m}^{(2)}$ after the phase calibration according to $\theta^{(2)}$:

$$c'_{k,m}^{(2)} = c_{k,m}^{(2)} \cdot \exp(-j*\theta^{(2)}).$$

Preferably, the update module comprises:

a first generation module, configured to generate a first lookup table $LUT1_m(|y_1(n-m)|, |y_2(n-m)|)$, according to the first frequency band feedback signal and the second frequency band feedback signal:

$$LUT1_m(|y_1(n-m)|, |y_2(n-m)|) = \sum_{k=0}^{K-1} c'^{(1)}_{k,m} \cdot \sum_{p=0,1,\ldots}^{k/2} (b_{k,p}|y_1(n-m)|^{k-2p}|y_2(n-m)|^{2p})$$

wherein, $b_{k,p}$ is a weighting coefficient of interaction between the first frequency band and the second frequency band, $y_1(n)$ is the first frequency band feedback signal, $y_2(n)$ is the second frequency band feedback signal, $n=1, 2, \ldots, N$, and N is signal length;

a first input signal acquisition module, configured to acquire a first frequency band input signal $x_1(n)$;

a first amplitude calculation module, configured to calculate an amplitude $|x_1(n-m)|$ of the first frequency band input signal when the depth of memory is M;

a first update module, configured to, by using the amplitude $|x_1(n-m)|$ of the first frequency baud input signal as an input address, store the first frequency band pre-distortion coefficient in the first lookup table in a from-small-to-large sequence according to the input address, to update the first lookup table;

a second generation module, configured to generate a second lookup table $LUT2_m(|y_2(n-m)|, |y_1(n-m)|)$, according to the first frequency band feedback signal and the second frequency band feedback signal, wherein $$LUT2_m(|y_2(n-m)|, |y_1(n-m)|) = \sum_{k=0}^{K-1} c'^{(2)}_{k,m} \cdot \sum_{p=0,1,\ldots}^{k/2} (b_{k,p}|y_2(n-m)|^{k-2p}|y_1(n-m)|^{2p})$$

wherein, $b_{k,p}$ is a weighting coefficient of interaction between the first frequency band and the second frequency band $y_1(n)$ is the first frequency band feedback signal, $y_2(n)$ is the second frequency band feedback signal, $n=1, 2, \ldots, N$, and N is signal length;

a second input signal acquisition module, configured to acquire a second frequency band input signal $x_2(n)$;

a second amplitude calculation module, configured to calculate an amplitude $|x_2(n-m)|$ of the second frequency band input signal when the depth of memory is M;

a second update module, configured to, by using the amplitude $|x_2(n-m)|$ of the second frequency band input signal as an input address, store the second frequency band pre-distortion coefficient in the second lookup table in a from-small-to-large sequence according to the input address, to update the second lookup table.

Preferably, the weighting coefficient $b_{k,p}$ is a constant.

Compared with the prior art, the embodiments of the present application have following advantages:

Firstly, according to the embodiments of the present application, when the method and the system for updating the multi-frequency band pre-distortion coefficient lookup table updates a DPD coefficient lookup table of a frequency band, a feedback signal of another frequency band may be introduced, such that the update process of the DPD coefficient lookup table takes into account the interaction of signals of two frequency bands and the calculated DPD coefficient is more accurate.

Secondly, in the calculation process of the embodiments of the present application, the weighting coefficient $b_{k,p}$ of interaction between the first frequency band and the second frequency band is set to a constant, so as to reduce repeated calculation due to different in the generation of the DPD coefficient lookup table, simplify the calculation process and reduce the length of DPD coefficient. Meanwhile, a quantization factor is further provided for the DPD coefficient lookup table, in order to facilitate the realization of FPGA (Field Programmable Gate Array).

Moreover, in the embodiments of the present application, after the first frequency band pre-distortion coefficient and the second frequency band pre-distortion coefficient are calculated, the pre-distortion coefficients are further performed the phase calibration, and then the DPD coefficient lookup tables are updated according to the pre-distortion coefficients performed the phase calibration. Through the phase calibration of the pre-distortion coefficients, the phase of the arithmetic sum of the pre-distortion coefficient for each frequency band is zero, such that the phase of superimposed multi-frequency band signals has no deviation when DPD coefficient lookup tables are updated, whereby improving the accuracy of the DPD processing.

BRIEF DESCRIPTION OF THE DRAWINGS

FIG. 1 is a block diagram showing a DPD processing of dual-frequency band in prior art;

FIG. 2 is a flow chat of a method for updating multi-frequency band pre-distortion coefficient lookup table according to a first embodiment of the present application;

DETAILED DESCRIPTION OF THE EMBODIMENTS

Figure 3:
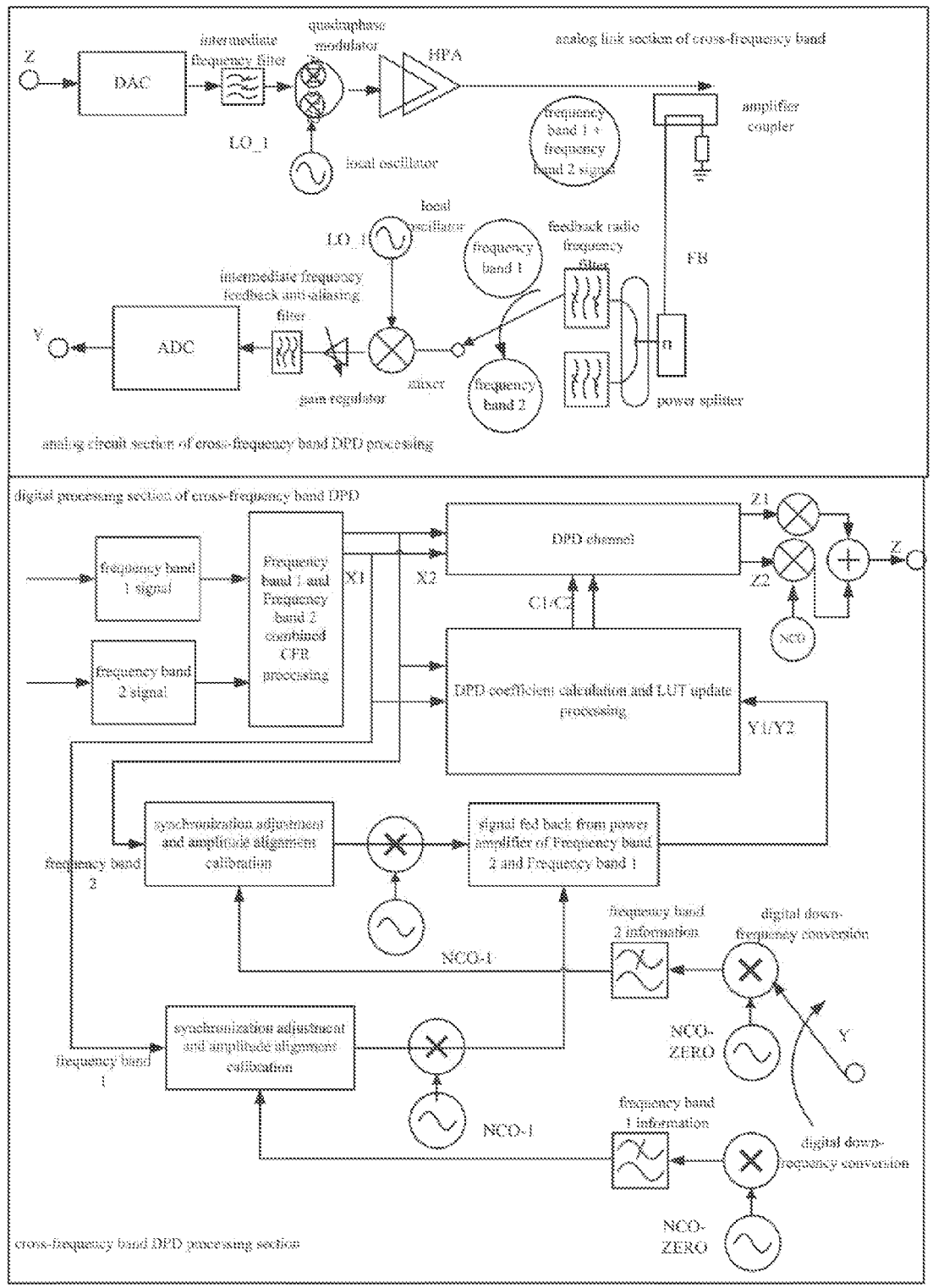
FIG. 3 is a schematic diagram of an overall structural of the multi-frequency band processing according to the embodiment of the present application.

In order to readily understand the above objects, features and advantages of the present application, the schemes of the present application will be described detailedly in conjunction with accompanying drawings and specific embodiments hereinafter.

The embodiment of the present application is directed to the processing of the multi-frequency band pre-distortion coefficient lookup table. In the processing, the interaction of signals of two frequency bands is taken into account and the weighting coefficient $b_{k,p}$ of the interaction of the two frequency bands is set to a constant, thereby simplifying calculation process and reducing the length of the DPD coefficient; meanwhile, a phase calibration is performed on the calculated pre-distortion coefficient, improving the accuracy of the DPD processing.

In the DPD technique, the DPD processing of signals is usually performed by pre-distortion coefficients, the DPD coefficients are mainly stored in the DPD lookup table, and each time the DPD coefficients are calculated, the DPD lookup table may be updated once, i.e., the DPD coefficients stored in the DPD lookup table may be updated.

In existing DPD technique, the research on updating the DPD lookup table is mainly directed to single frequency band signals. For the multi-frequency band, if the processing of single frequency band is used for a signal of each frequency; then the calculation complexity will be high and calculated pre-distortion coefficient will be unstable.

For example, with reference to FIG. 1, it shows a block diagram of a DPD processing of dual-frequency band in prior art, including a signal extraction and analysis stage, a processing stage and a synthesis stage.

Assuming an N-order of non-linearity and an M-level of memory, respective output signals of an Analog-to-Digital Converter (ADC) are as follows:

$$y_1(n) = \sum_{m=0}^{M-1}\sum_{k=0}^{N}\sum_{j=0}^{k} c_{k,j,m}^{(1)} x_1(n-m) \times |x_1(n-m)|^{k-j} |x_2(n-m)|^j$$

$$y_2(n) = \sum_{m=0}^{M-1}\sum_{k=0}^{N}\sum_{j=0}^{k} c_{k,j,m}^{(2)} x_2(n-m) \times |x_1(n-m)|^{k-j} |x_2(n-m)|^j$$

wherein, $y_1(n)$ is an output signal of ADC corresponding to a first frequency band, $y_2(n)$ is an output signal of ADC corresponding to a second frequency band, $x_1(n-m)$ is an input signal of the first frequency band $x_2(n-m)$ is an input signal of the second frequency band, $c_{k,j,m}^{(1)}$ a DPD coefficient of the first frequency band, $c_{k,j,m}^{(2)}$ is a DPD coefficient of the second frequency band.

Therefore, each length of DPD coefficient $c_{k,j,m}^{(1)}$ and $c_{k,j,m}^{(2)}$ acquired using the above method is as follows:

$$\vec{C} = [c_{0,0,0}^{(i)} c_{1,0,0}^{(i)} c_{1,1,0}^{(i)} \ldots c_{i,j,0}^{(i)} \ldots c_{N,N,0}^{(i)} \ldots c_{N,N,M-1}^{(i)}]^T$$

That is to say, the length of the DPD coefficient is M(K)K/2. Therefore, the calculation process of the DPD coefficient is very complex, such that it is difficult for the existing system to be realized.

Aiming at the above problems, an embodiment of the present application provides a method for updating multi-frequency band pre-distortion coefficient lookup table. With reference to FIG. 2 it snows a flow chat of the method according to the embodiment of the present application. The method may particularly include:

Step 200, collecting a first frequency band reference signal and a first frequency band feedback signal, and a second frequency band reference signal and a second frequency band feedback signal.

Step 202, calculating a first frequency band pre-distortion coefficient and a second frequency band pre-distortion coefficient, according to the first frequency band reference signal and the first frequency band feedback signal, and the second frequency band reference signal and the second frequency band feedback signal.

Step 204, performing phase calibration on the first frequency band pre-distortion coefficient and the second frequency band pre-distortion coefficient, respectively.

Step 206, updating a first lookup table according to the first frequency band pre-distortion coefficient performed the phase calibration, and updating a second lookup table according to the second frequency band pre-distortion coefficient performed the phase calibration.

Herein, the first lookup table is a first frequency band pre-distortion coefficient lookup table, and the second lookup table is a second frequency band pre-distortion coefficient lookup table.

Specific processes of each of the above steps will be described in following embodiments in detail.

According to the embodiment of the present application, when the method for updating the multi-frequency band pre-distortion coefficient lookup table updates the DPD coefficient lookup table of a frequency band, a feedback signal of another frequency band may be introduced, such that the update process of the DPD coefficient lookup table takes into account the interaction of signals of two frequency bands and the calculated DPD coefficient is more accurate.

Hereinafter, the method for updating the multi-frequency band pre-distortion coefficient lookup table according to the embodiment of the present application will be described in detail.

First, the overall structure of the multi-frequency band processing according to the embodiment of the present application will be introduced. As shown in FIG. 3, it may include a first frequency band signal and a second frequency band signal, the frequency bands of which has a difference of 120 MHz. Herein, the upper half of FIG. 3 is an analog link section of cross-frequency band DPD processing, the lower half is a digital processing section of cross-frequency band DPD.

As can be seen from FIG. 3, in the transmission channel, a synthesis signal Z of the first frequency band and the second frequency band is outputted to an intermediate frequency filter through a Digital to analog converter (DAC), inputted to a quadraphase modulator after filtering, then outputted to a High Power Amplifier (HPA) via the quadraphase modulator, and a radio frequency signal (a signal with frequency band 1 and frequency band 2) is sent out.

Meanwhile, the signal outputted from the HPA is coupled to an amplifier coupler in a feedback channel, then splitted into a first frequency band radio frequency signal and a second frequency band radio frequency signal by a power splitter, performed radio frequency analog filtering by a feedback radio frequency filter, respectively; only one of the first frequency band radio frequency signal and the second frequency band radio frequency signal is acquired each time by switch settings; the respectively acquired first frequency band signal and the second frequency band signal subsequently enter a common mixer, an intermediate frequency amplifier and an intermediate frequency feedback anti-aliasing filter, and finally are sent to an ADC for sampling. Herein, the intermediate frequency amplifier may be regarded as a part of a gain regulator.

It should be explained that, when the first frequency band radio frequency signal and the second frequency baud radio frequency signal are acquired respectively, a time-sharing collection manner could be employed. That is the first frequency band signal may be collected first and then the second frequency band signal is collected. Certainly, other collection manners also could be employed, and the embodiment of the present application is not intended to limit thereon.

In the collection of non-linear intermodulation distortion of each frequency band, the process may include:

(1) sampling the filtered signal by the ADC;
(2) down-converting the sampled signal of each frequency band to zero frequency; and
(3) filtering and extracting the down-converted signal.

In the embodiment of the present application, the sampled first frequency band signal and second frequency band signal are both down-converted to the base frequency (zero frequency), a low pass filter filters out collected mirror signals by real numbers while retaining effective signals. Since only the first frequency band signal or the second frequency band signal is sampled by the ADC, the single frequency band signal may be filtered and extracted after being down-converted to zero frequency, realizing a restraint on the mirror. Then the filtered signal may be performed a synchronization adjustment and an amplitude alignment calibration, and performed a DPD coefficient calculation and a LUT update processing. During the DPD coefficient calculation and the LUT update processing, the first frequency band signal Z1 and the second frequency band signal Z2 in the DPD channel can be used. At the end, the acquired LUT1 (n) and LUT2 (n) are sent to the DPD channel to perform the DPD processing, and the first frequency band signal Z1 and the second frequency band signal Z2 are superimposed to finally generate an output signal.

In practice, since the first frequency band and the second frequency band are sampled separately, the requirement on the signal rate of ADC sampling can be reduced.

Figure 4:
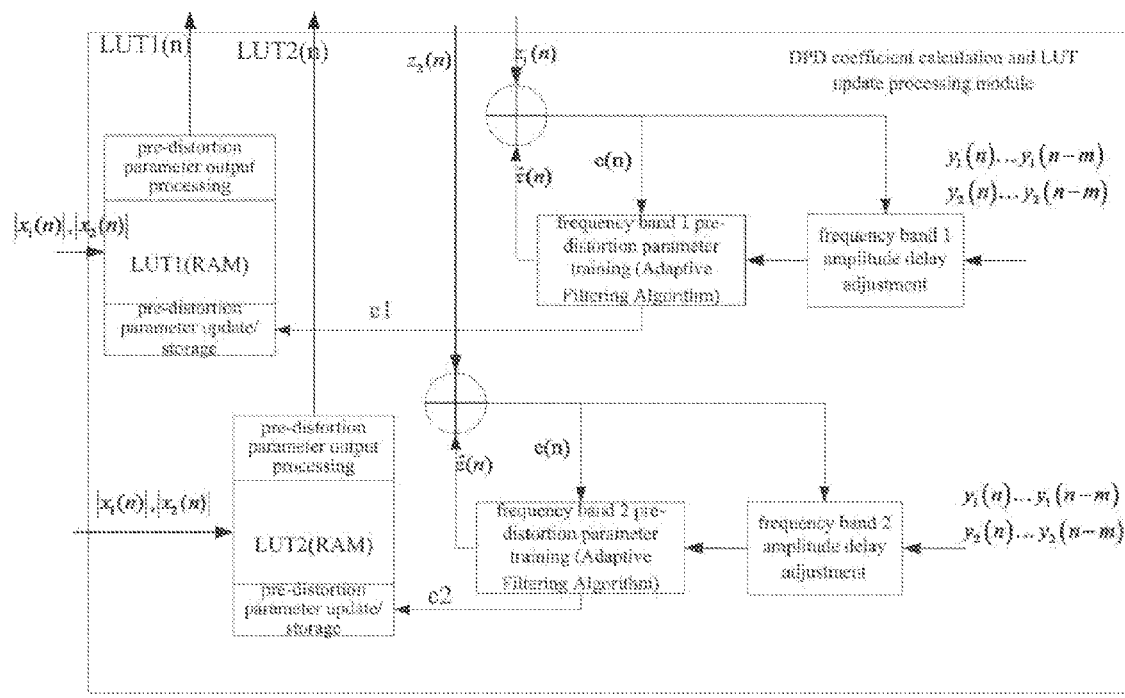
FIG. 4 is a schematic diagram of a DPD coefficient calculation and a LUT update processing according to the embodiment of the present application.

In the embodiment of the present application, the DPD coefficient calculation and the LUT update processing are substantially introduced. FIG. 4 shows a schematic diagram of this process.

In the embodiment of the present application, in FIG. 4, $y_1$ (n−m) is the first frequency band feedback signal, $y_2$ (n) ... $y_2$ (n−m) is the second frequency band feedback signal, $z_1$ (n) is the first frequency band reference signal, and $z_2$ (n) is the second frequency band reference signal.

First, the first frequency band feedback signal $y_1$ (n) ... $y_1$ (n−m) and the second frequency band feedback signal $y_2$ (n) ... $y_2$ (n−m) are performed amplitude adjustment respectively and then performed pre-distortion parameter training (Adaptive Filtering Algorithm), wherein e (n) is an error signal acquired by comparing z (n) to ẑ(n) The less the error signal is, the more accurate the calculation result is and the better the system performs. A DPD coefficient c1 corresponding to the first frequency band signal and a DPD coefficient c2 corresponding to the second frequency band signal can be acquired after training, and then the amplitude $|x_1(n)|$ of a first frequency band input signal $x_1$ (n) and the amplitude $|x_2(n)|$ of a second frequency band input signal $x_2$ (n) are used as addresses to store the DPD coefficient c1 of the first frequency band signal in a LUT1 and to store the DPD coefficient c2 of the second frequency band signal in a LUT2 respectively, so as to update the LUT1 and the LUT2.

Figure 5:
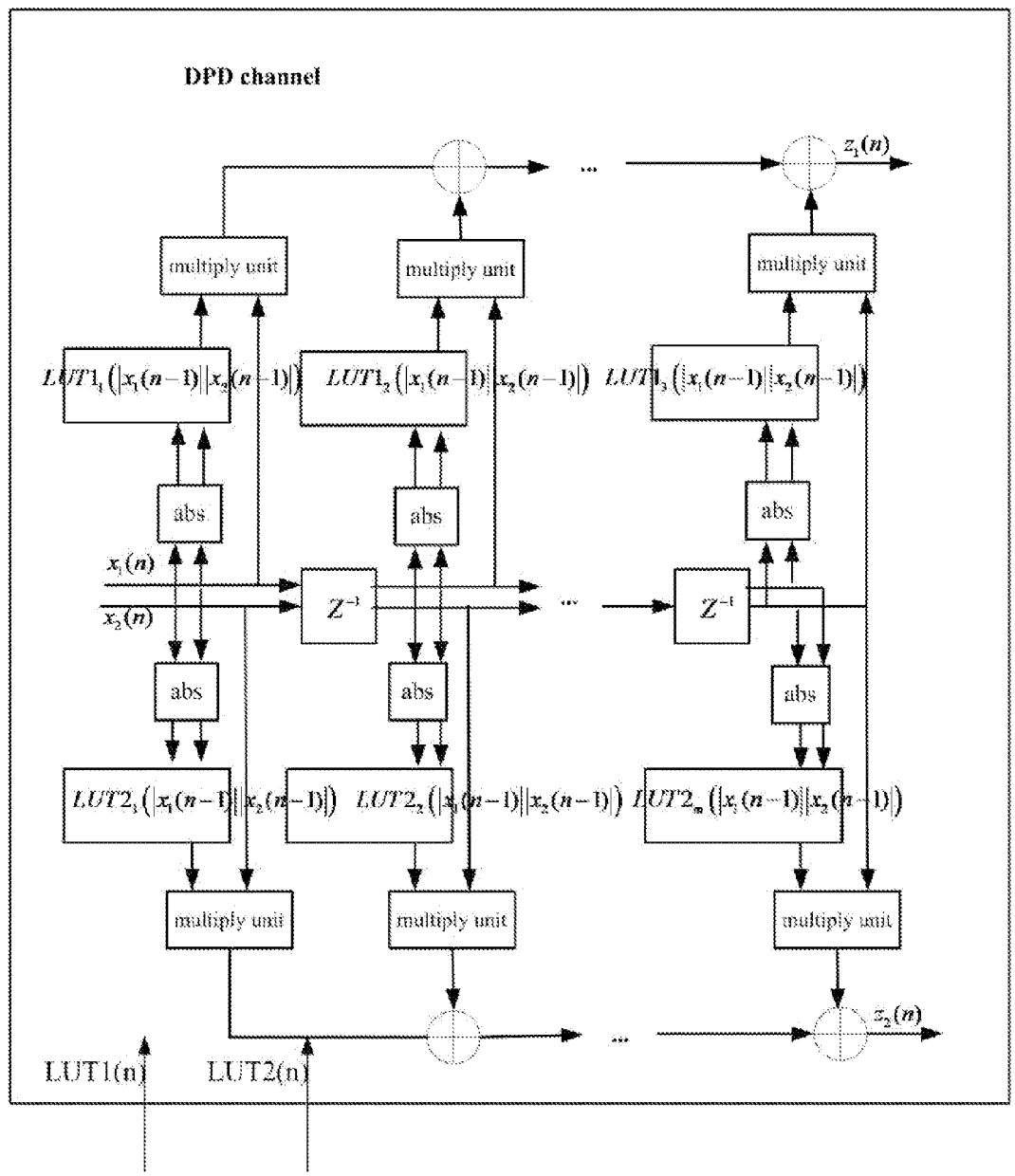
FIG. 5 is a schematic diagram of DPD channel processing according to the embodiment of the present application.

After the LUT1 and the LUT2 are acquired, they are inputted to the DPD channel, in which the pre-distortion processing is performed. With reference to FIG. 5, it shows a schematic diagram of the DPD channel processing according to the embodiment of the present application.

The LUT1 and the LUT2 acquired through the DPD coefficient calculation and the LUT update processing are inputted to the DPD channel to be processed, while the amplitude $|x_1(n)|$ of the first frequency band input signal $x_1$ (n) and the amplitude $|x_2(n)|$ of the second frequency band input signal $x_2$ (n) are calculated (calculated by abs in the diagram), then by using $|x_1(n)|$ and as addresses, corresponding DPD coefficients are extracted from the LUT1 and the LUT2 and sent to a multiply unit, finally to acquire a first frequency band output signal $z_1$ (n) and a second frequency band output signal $z_2$ (n) after being processed by an adder (in the DPD processing, z (n) represents an output signal).

Detailed procedure of the DPD processing will be omitted in the embodiment of the present application.

Hereinafter, the specific process of updating multi-frequency band pre-distortion coefficient lookup table according the embodiment of the present application will be farther explained.

Figure 6:
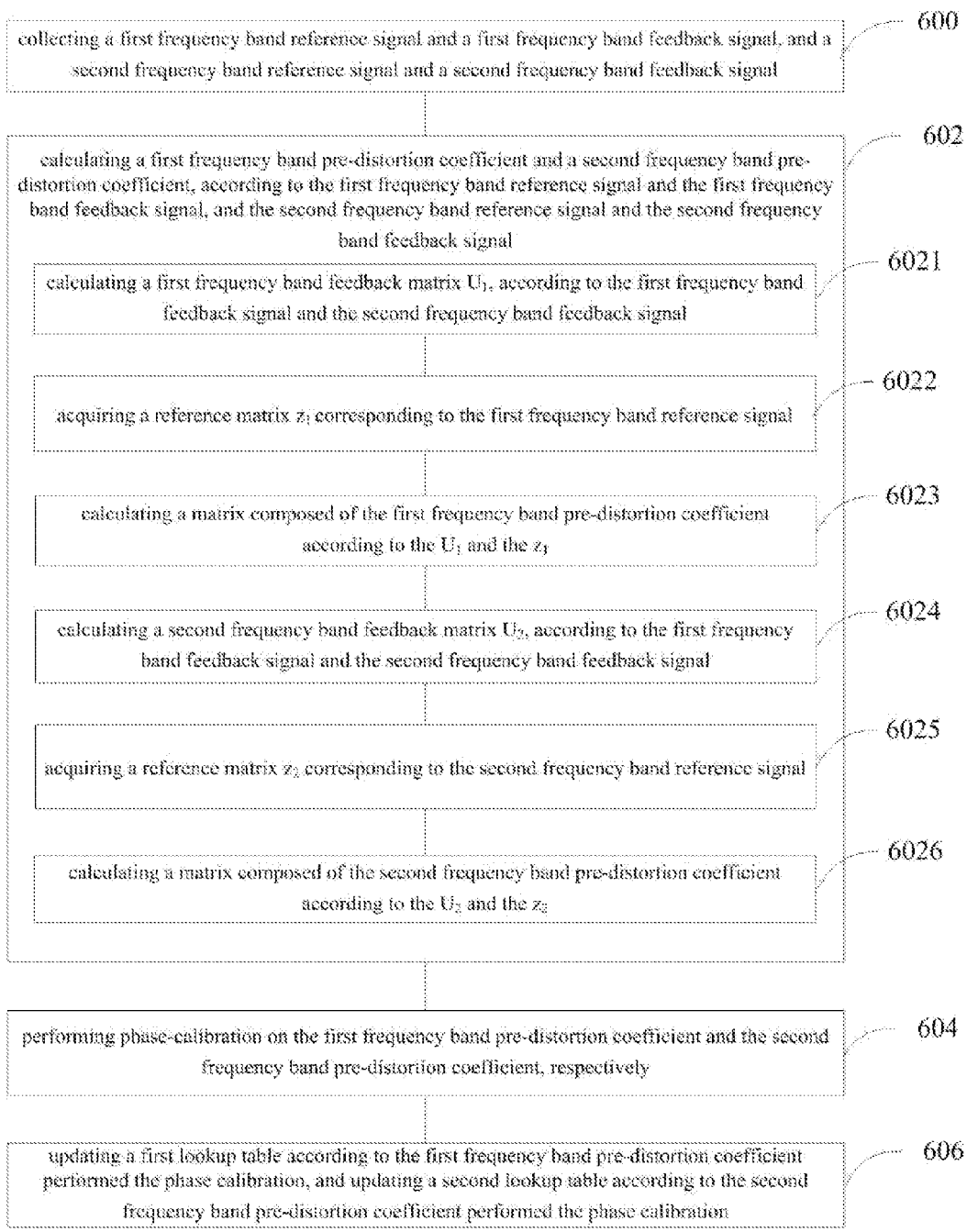
FIG. 6 is a flow chart of a method for updating multi-frequency band pre-distortion. coefficient lookup table according to a second embodiment of the present application.

With reference to FIG. 6, it shows a flow chart of a method for updating multi-frequency band pre-distortion coefficient lookup table according the embodiment of the present application. The method may particularly include:

Step 600, collecting a first frequency band reference signal and a first frequency band feedback signal, and a second frequency band reference signal and a second frequency band feedback signal.

In the embodiment of the present application, as for the first frequency band and the second frequency band, the first frequency band reference signal and the first frequency band feedback signal, and the second frequency band reference signal and the second frequency band feedback signal are respectively collected, and during the subsequent calculation of the DPD coefficient of each frequency band, the reference signal and the feedback signal of present frequency band and the feedback signal of another frequency band can be used for calculation.

Since the feedback signal of another frequency band is introduced, procedures of the DPD coefficient calculation and the DPD coefficient lookup table update have taken the interaction of two frequency bands of signals into account, such that the calculated DPD coefficient is more accurate.

Step 602, calculating a first frequency band pre-distortion coefficient and a second frequency band pre-distortion coefficient, according to the first frequency band reference signal and the first frequency band feedback signal, and the second frequency band reference signal and the second frequency band feedback signal.

Hereinafter, the calculation process of the first frequency band pre-distortion coefficient and the calculation process of the second frequency band pre-distortion coefficient will be explained, respectively.

In the embodiment of the present application, the calculation process of the first frequency band pre-distortion coefficient in the Step 602 may particularly include:

Sub-Step 6021, calculating a first frequency band feedback matrix $U_1$, according to the first frequency band feedback signal and the second frequency band feedback signal.

In particular, the Sub-Step 6021 may comprise:

a1, calculating, a first frequency band feedback parameter $u_{km}^{(1)}(n)$:

$$u_{km}^{(1)}(n) = y_1(n-m) \sum_{k=0}^{K-1} \sum_{p=0,1,\ldots}^{\lceil k/2 \rceil} (|y_1(n-m)|^{k-2p} |y_2(n-m)|^{2p})$$

a2, calculating a transpose matrix $u_{km}^{(1)}$ of the matrix composed of $u_{km}^{(1)}(n)$:

$$u_{km}^{(1)} = [u_{km}^{(1)}(0), \ldots, u_{km}^{(1)}(N-1)]^T$$

a3, calculating, the first frequency band feedback matrix $U_1$ composed of the $u_{km}^{(1)}$:

$$U_1 = [u_{11}^{(1)}, \ldots, u_{km}^{(1)}, \ldots, u_{KM}^{(1)}]$$

wherein, $y_1(n)$ is the first frequency band feedback signal, $y_2(n)$ is the second frequency band feedback signal, $n=1, 2, \ldots, N$, and N is the signal length.

Sub-Step 6022, acquiring a reference matrix $z_1$ corresponding to the first frequency band reference signal.

First, the relation between the first frequency band reference signal and the first frequency band feedback signal $y_1(n)$ will be explained.

If only non-linearity is taken into account for the first frequency baud and the second frequency band, then:

$$z_1(n) = x_1(n) \cdot \sum_{k=0}^{K-1} c_k^{(1)} \cdot \left[ \sum_{p=0,1,\ldots}^{\lceil k/2 \rceil} (b_{k,p} |x_1(n)|^{k-2p} |x_2(n)|^{2p}) \right]$$

wherein, $x_1(n)$ is a first frequency band input signal, $x_2(n)$ is a second frequency band input signal, and $b_{k,p}$ is a weighting coefficient of interaction between the first frequency band and the second frequency band.

If memory is taken into account, then:

$$\hat{z}_1(n) = \sum_{M=0}^{M-1} y_1(n-m) \cdot \sum_{k=0}^{K-1} c_{k,m}^{(1)} \cdot \left[ \sum_{p=0,1,\ldots}^{\lceil k/2 \rceil} (b_{k,p} |y_1(n-m)|^{k-2p} |y_2(n-m)|^{2p}) \right]$$

In the embodiment of the present application, $b_{k,p}$ is set to a constant, so as to reduce repeated calculation due to different $b_{k,p}$, simplify the calculation process and reduce the length of DPD coefficient.

For example, if $b_{k,p}$ is not a constant, then:

$$\hat{z}_1(n) = y_1(n) \cdot \sum_{k=0}^{K-1} \sum_{p=0,1,\ldots}^{\lceil k/2 \rceil} c_{k,p}^{(1)} \cdot [(|y_1(n)|^{k-2p} |y_2(n)|^{2p})]$$

Therefore, the calculated length of DPD coefficient is relatively long and the calculation complexity is high.

It could be seen from above analysis: $\hat{z}_1(n) = U_1 c_1$
wherein, $\hat{z}_1(n) = [z_1(0), \ldots, z_1(N-1)]^T$ Sub-Step 6023, calculating a matrix $\hat{c}_1$ composed of the first frequency band pre-distortion coefficient according to the $U_1$ and the $z_1$:

$$\hat{c}_1 = (U_1^H U_1)^{-1} U_1^H \cdot z_1$$

wherein, $\hat{c}_1 = [c_{1,1}^{(1)}, c_{2,1}^{(1)}, \ldots, c_{k,m}^{(1)}, \ldots, c_{K,M}^{(1)}]$, $c_{k,m}^{(1)}$ is the first frequency band pre-distortion coefficient, $k=1, 2, \ldots, K$, $m=1, 2, \ldots, M$, K is a non-linear order and M is the depth of memory.

The formula $\hat{z}_1(n) = U_1 c_1$ from the Sub-Step 6022 can acquire $\hat{c}_1 = (U_1^H U_1)^{-1} U_1^H \cdot z_1$ through derivation.

In the embodiment of the present application, the calculation process of the second frequency band pre-distortion coefficient in the Step 602 may particularly include:

Sub-Step 6024, calculating a second frequency band feedback matrix $U_2$, according to the first frequency band feedback signal and the second frequency band feedback signal.

In particular, the Sub-Step 6024 may comprise:

b1, calculating a second frequency band feedback parameter $u_{km}^{(2)}(n)$:

$$u_{km}^{(2)}(n) = y_2(n-m) \sum_{k=0}^{K-1} \sum_{p=0,1,\ldots}^{\lceil k/2 \rceil} (|y_2(n-m)|^{k-2p} |y_1(n-m)|^{2p})$$

b2, calculating a transpose matrix $u_{km}^{(2)}$ of the matrix composed of $u_{km}^{(2)}(n)$:

$$u_{km}^{(2)} = [u_{km}^{(2)}(0), \ldots, u_{km}^{(2)}(N-1)]^T$$

b3, calculating the second frequency band feedback matrix $U_2$ composed of $u_{km}^{(2)}$:

$$U_2 = [u_{11}^{(2)}, \ldots, u_{km}^{(2)}, \ldots, u_{KM}^{(2)}]$$

wherein, $y_1(n)$ is the first frequency band feedback signal, $y_2(n)$ is the second frequency band feedback signal, $n=1, 2, \ldots, N$, and N is the signal length.

Sub-Step 6025, acquiring a reference matrix $z_2$ corresponding to the second frequency band reference signal.

Similarly to the analysis of the first frequency band, in consideration of both the non-linearity and the memory, the relation between the second frequency band reference signal $z_2(n)$ and the first frequency band feedback signal $y_2(n)$ is as follows:

$$\hat{z}_2(n) = \sum_{M=0}^{M-1} y_2(n-m) \cdot \sum_{k=0}^{K-1} c_{k,m}^{(2)} \cdot \left[ \sum_{p=0,1,\ldots}^{\lceil k/2 \rceil} (b_{k,p} |y_2(n-m)|^{k-2p} |y_1(n-m)|^{2p}) \right]$$

Similarly, in the formula, $b_{k,p}$ is also a constant.

It could be seen from analysis: $\hat{z}_2(n) = U_2 c_2$
wherein, $\hat{z}_2(n) = [z_2(0), \ldots, z_2(N-1)]^T$.

Sub-Step 6026, calculating a matrix $\hat{c}_2$ composed of the second frequency band pre-distortion coefficient according to the $U_2$ and the $z_2$:

wherein, $\hat{c} = [c_{1,1}{}^{(2)}, c_{2,1}{}^{(2)}, \ldots c_{k,m}{}^{(2)}, \ldots c_{K,M}{}^{(2)}]$, $c_{k,m}{}^{(2)}$ is the second frequency band. pre-distortion coefficient.

The formula $\hat{z}_2(n) = U_2 c_2$ from the Sub-Step 6025 can acquire $\hat{c}_2 = (U_2{}^H U_2)^{-1} U_2{}^H \cdot z^2$ through derivation.

In above analysis of the first frequency band and the second frequency band, value examples of the constant $b_{k,p}$ are as follows:

When the non-linear order K=5:

$$U = [u_{11}, \ldots u_{km} \ldots, u_{KM}]_{N*KM},$$

$$u_{km} = [u_{km}(0), \ldots, u_{km}(N-1)]^T,$$

$$u_{m1}(n) = y_1(n-m),$$

$$u_{m2}(n) = y_1(n-m) \cdot (|y_1(n-m)|),$$

$$u_{m3}(n) = y_1(n-m) \cdot (|y_1(n-m)|^2 + 2|y_2(n-m)|^2),$$

$$u_{m4}(n) = y_1(n-m) \cdot (|y_1(n-m)|^3 + 2|y_1(n-m)||y_2(n-m)|^2),$$

$$u_{m5}(n) =$$
$$y_1(n-m) \cdot (|y_1(n-m)|^4 + 6|y_1(n-m)|^2|y_2(n-m)|^2 + 3|y_2(n-m)|^4)$$

$$\vdots$$

When the non-linear order K=7:

$$U = [u_{11}, \ldots u_{km} \ldots, u_{KM}]_{N*KM},$$

$$u_{km} = [u_{km}(0), \ldots, u_{km}(N-1)]^T,$$

$$u_{m1}(n) = y_1(n-m),$$

$$u_{m2}(n) = y_1(n-m) \cdot (|y_1(n-m)|),$$

$$u_{m3}(n) = y_1(n-m) \cdot (|y_1(n-m)|^2 + 2|y_2(n-m)|^2),$$

$$u_{m4}(n) = y_1(n-m) \cdot (|y_1(n-m)|^3 + 2 | y_1(n-m)||y_2(n-m)|^2),$$

$$u_{m5}(n) =$$
$$y_1(n-m) \cdot (|y_1(n-m)|^4 + 6|y_1(n-m)|^2|y_2(n-m)|^2 + 3|y_2(n-m)|^4)$$

$$u_{m6}(n) = y_1(n-m) \cdot \begin{pmatrix} |y_1(n-m)|^5 + 6|y_1(n-m)|^3|y_2(n-m)|^2 + \\ 3|y_1(n-m)|^1|y_2(n-m)|^4 \end{pmatrix}$$

$$u_{m7}(n) = y_1(n-m) \cdot \begin{pmatrix} |y_1(n-m)|^6 + 12|y_1(n-m)|^4|y_2(n-m)|^2 + \\ 18|y_1(n-m)|^2|y_2(n-m)|^4 + 4|y_2(n-m)|^6 \end{pmatrix}$$

$$\vdots$$

It should be explained that, the Sub-Step 6021 to the Sub-Step 6023 is a process of calculating the first frequency band, the Sub-Step 6024 to the Sub-Step 6026 is a process of calculating the second frequency band; various steps are not restricted by the sequence, in such a manner that the Sub-Step 6021 to the Sub-Step 6023 can be performed first or the Sub-Step 6024 to the Sub-Step 6026 can be performed first, and the embodiment of the present application is not intended to limit thereon.

Step 604, performing phase-calibration on the first frequency band pre-distortion coefficient and the second frequency band pre-distortion coefficient, respectively.

After the first frequency band pre-distortion coefficient and the second frequency band. pre-distortion coefficient are calculated in the Step 602, in order to improve the accuracy of the calculation, in the embodiment of the present application, the phase calibration may be further performed on the pre-distortion coefficients.

In the embodiment of the present application, the process of performing the phase calibration on the first frequency band pre-distortion coefficient in the Step 604 may particularly include:

Sub-Step 6041, calculating a first frequency band phase calibration factor $\theta^{(1)}$:

$$\theta^{(1)} = \text{angle}\left(\sum_{m=1}^{M-1}\sum_{k=0}^{K-1} c_{k,m}^{(1)}\right);$$

Sub-Step 6042, calculating a first frequency band pre-distortion coefficient $c'_{k,m}{}^{(1)}$ after the phase calibration according to $\theta^{(1)}$:

$$c'_{k,m}{}^{(1)} = c_{k,m}{}^{(1)} \cdot \exp(-j*\theta^{(1)});$$

In the embodiment of the present application, the process of performing the phase calibration on the second frequency band pre-distortion coefficient in the Step 604 may particularly include:

Sub-Step 6043, calculating a second frequency band phase calibration factor $\theta^{(2)}$:

$$\theta^{(2)} = \text{angle}\left(\sum_{m=1}^{M-1}\sum_{k=0}^{K-1} c_{k,m}^{(2)}\right);$$

Sub-Step 6044, calculating a second frequency band pre-distortion coefficient $c'_{k,m}{}^{(2)}$ after the phase calibration according to $\theta^{(2)}$:

$$c'_{k,m}{}^{(2)} = c_{k,m}{}^{(2)} \cdot \exp(-j*\theta^{(2)}).$$

Similarly, the Sub-Step 6041 to the Sub-Step 6042 is a process of performing the phase calibration on the first frequency band, the Sub-Step 6043 to the Sub-Step 6044 is a process of performing, the phase calibration on the second frequency band; various steps are not restricted by the sequence, in such a manner that the Sub-Step 6041 to the Sub-Step 6042 can be performed first or the Sub-Step 6043 to the Sub-Step 6044 can be performed first, and the embodiment of the present application is not intended to limit thereon.

Through above phase calibration, the phase of pre-distortion coefficient arithmetic sum for each frequency band is zero, such that the phase of superimposed multi-frequency band. signals has no deviation and the pre-distortion calibration of the multi-frequency band signal is more accurate.

Step 606, updating a first lookup table according to the first frequency band pre-distortion coefficient performed the phase calibration, and updating a second lookup table according to the second frequency band pre-distortion coefficient performed the phase calibration.

Herein, the first lookup table is a first frequency band pre-distortion coefficient lookup table, and the second lookup table is a second frequency band pre-distortion coefficient lookup table.

According to the following formula derived from the Step 602:

$$\hat{z}_1(n) = \sum_{M=0}^{M-1} y_1(n-m) \cdot \sum_{k=0}^{K-1} c_{k,m}^{(1)} \cdot \left[\sum_{p=0,1,\ldots}^{[k/2]} (b_{k,p}|y_1(n-m)|^{k-2p}|y_2(n-m)|^{2p})\right]$$

The formula is transformed to a lookup table form of:

$$\hat{z}_1(n) = \sum_{M=0}^{M-1} y_1(n-m) \cdot LUT1_m(|y_1(n-m)|, |y_2(n-m)|)$$

According to the following formula derived from the Step 602:

$$\hat{z}_2(n) = \sum_{M=0}^{M-1} y_2(n-m) \cdot \sum_{k=0}^{K-1} c_{k,m}^{(2)} \cdot \left[ \sum_{p=0,1,...}^{\lceil k/2 \rceil} (b_{k,p}|y_2(n-m)|^{k-2p}|y_1(n-m)|^{2p}) \right]$$

The formula is transformed to a lookup table form of:

$$\hat{z}_2(n) = \sum_{M=0}^{M-1} y_2(n-m) \cdot LUT2_m(|y_2(n-m)|, |y_1(n-m)|)$$

Therefore, in the embodiment of the present application, in the Step 606, the process of updating the first lookup table according to the first frequency band pre-distortion coefficient performed the phase calibration may particularly include:

Sub-Step 6061, generating the first lookup table $LUT1_m$ ($|y_1(n-m)|$, $|y_2(n-m)|$), according to the first frequency band feedback signal and the second frequency band feedback signal:

$$LUT1_m(|y_1(n-m)|, |y_2(n-m)|) = \sum_{k=0}^{K-1} c_{k,m}^{(1)} \cdot \sum_{p=0,1,...}^{k/2} (b_{k,p}|y_1(n-m)|^{k-2p}|y_2(n-m)|^{2p})$$

wherein, $b_{k,p}$ is a weighting coefficient of interaction between the first frequency band and the second frequency band, $y_1(n)$ is the first frequency band feedback signal, $y_2$ is the second frequency band feedback signal, $n=1, 2, \ldots, N$, and N is the signal length.

Sub-Step 6062, acquiring a first frequency band input signal $x_1(n)$.

Sub-Step 6063, calculating an amplitude $|x_1(n-m)|$ of the first frequency band input signal when the depth of memory is M.

Sub-Step 6064, by using the amplitude $|x_1(n-m)|$ of the first frequency band input signal as an input address, storing the first frequency band pre-distortion coefficient in the first lookup table in a from-small-to-large sequence according to the input address, to update the first lookup table.

Preferably, in the embodiment of the present application, a quantization factor is further provided for the first lookup table, in order to facilitate the realization of FPGA. Therefore, after generating the first lookup table according to the first frequency band feedback signal. and the second frequency band feedback signal, the method may further comprise:

c1, acquiring a maximum value $mv_1$ of the first frequency band input signal and a maximum size $L_1$ of the first lookup table, and a maximum size $L_2$ of the second lookup table.

c2, dividing the maximum value my by the maximum size $L_1$, and using the calculated result as a first frequency band quantization factor $\Delta_1$.

c3, transforming the first lookup table $LUT1_m(|y_1(n-m)|, |y_2(n-m)|)$ to $LUT1'_m(l_1\Delta_1, l_2\Delta_1)$, according to the first frequency band quantization factor $\Delta_1$:

$$LUT1'_m(l_1\Delta_1, l_2\Delta_1) = \sum_{k=0}^{K-1} c_{k,m}^{'(1)} \cdot \sum_{p=0,1,...}^{k/2} (b_{k,p}(l_1\Delta_1)^{k-2p}(l_2\Delta_1)^{2p});$$

wherein, $l_1=1, 2, \ldots, L_1$, and $l_2=1, 2, \ldots, L_2$.

Therefore, the Sub-Step 6064 of storing the first frequency band pre-distortion coefficient in the first lookup table may comprise:

storing the first frequency band pre-distortion coefficient in the transformed first lookup table.

In the embodiment of the present application, the process of updating the second lookup table according to the second frequency band pre-distortion coefficient performed phase calibration in the Step 606 may particularly include:

Sub-Step 6065, generating a second lookup table $LUT2_m$ ($|y_2(n-m)|$, $|y_1(n-m)|$), according to the first frequency band feedback signal and the second frequency band feedback signal wherein $$LUT2_m(|y_2(n-m)|, |y_1(n-m)|) = \sum_{k=0}^{K-1} c_{k,m}^{'(2)} \cdot \sum_{p=0,1,...}^{k/2} (b_{k,p}|y_2(n-m)|^{k-2p}|y_1(n-m)|^{2p})$$

wherein, $b_{k,p}$ is a weighting coefficient of interaction between the first frequency band and the second frequency band, $y_1(n)$ is the first frequency band feedback signal, $y_2(n)$ is the second frequency band feedback signal, $n=1, 2, \ldots, N$, and N is the signal length.

Sub-Step 6066, acquiring a second frequency band input signal $x_2(n)$.

Sub-Step 6067, calculating an amplitude $|x_2(n-m)|$ of the second frequency band input signal when the depth of memory is M.

Sub-Step 6068, by using the amplitude $|x_2(n-m)|$ of the second frequency band input signal as an input address, storing the second frequency band pre-distortion coefficient in the second lookup table in a from-small-to-large sequence according to the input address, to update the second lookup table.

Similarly, in the embodiment of the present application, a quantization factor is further provided for the second lookup table. Therefore, after generating the second lookup table according to the first frequency band feedback signal and the second frequency band feedback signal, the method may further comprise:

d1, acquiring a maximum value $mv_2$ of the second frequency band input signal and a maximum size $L_2$ of the second lookup table, and a maximum size $L_1$ of the first lookup table.

d2, dividing the maximum value $mv_2$ by the maximum size $L_2$, and using the calculated result as a second frequency band quantization factor $\Delta_2$.

d3, transforming the second lookup table $LUT2_m(|y_2(n-m)|, |y_1(n-m)|)$ to $LUT2'_m(l_2\Delta_2, l_1\Delta_2)$, according to the second frequency band quantization factor $\Delta_2$, wherein $$LUT2'_m(l_2\Delta_2, l_1\Delta_2) = \sum_{k=0}^{K-1} c_{k,m}^{'(2)} \cdot \sum_{p=0,1,...}^{k/2} (b_{k,p}(l_2\Delta_2)^{k-2p}(l_1\Delta_2)^{2p});$$

wherein, $l_1=1, 2, \ldots, L_1$, and $l_2=1, 2, \ldots, L_2$.

Therefore, the Sub-Step 6068 of storing the second frequency band pre-distortion coefficient in the second lookup table may comprise:

storing the second frequency band pre-distortion coefficient in the transformed second lookup table.

Similarly, the Sub-Step 6061 to the Sub-Step 6064 is a process of updating the first frequency band lookup table, the Sub-Step 6065 to the Sub-Step 6068 is a process of updating the second frequency band lookup table; various steps are not restricted by the sequence, in such a manner that the Sub-Step 6061 to the Sub-Step 6064 can be performed first or the Sub-Step 6065 to the Sub-Step 6068 can be performed first, and the embodiment of the present application is not intended to limit thereon.

Through a series of formular derivations, it could be concluded that with respect to single frequency band, only a LUT is necessarily added for the processing of two frequency bands, Wherein a LUT is provided for the first frequency band, another LUT is provided for the second frequency band, and each of LUTs needs the amplitude information of the first frequency band and the second frequency band. Other hardware resources are similar to those of single frequency band, such that the embodiment of the present application may greatly simplify the calculation process of the multi-frequency band.

In the embodiment of the present application, storage space of the resultant DPD coefficient lookup table has a size of L*L*M. For example, in the case of first-level memory, the size and storage manner of the LUT of the first frequency band are as follows:

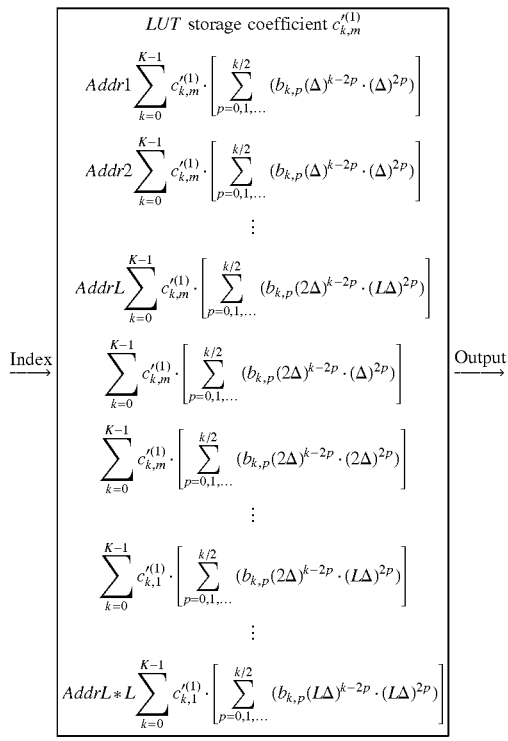

In the embodiment of the present application, the first frequency band signal $z_1(n)$ and the second frequency band signal $z_2(n)$ may be superimposed to acquire a resultant output signal, that is, $z(n)=z_1(n)+z_2(n)$. The detailed description of this process will be omitted in the embodiment of the invention.

In the end, it should be explained that, the first frequency band as described above may be a F frequency band, the second frequency band may be an A frequency band; the embodiment of the present application are not intended to limit thereon.

According to the embodiments of the present application, when the method far updating the multi-frequency band pre-distortion coefficient lookup table updates the DPD coefficient lookup table of a frequency band, a feedback signal of another frequency band may be introduced, such that the update process of the DPD coefficient lookup table takes into account the interaction of signals of two frequency bands and the calculated DPD coefficient is more accurate.

Secondly, in the calculation process of the embodiments of the present application, the weighting coefficient $b_{k,p}$ of interaction between the first frequency band and the second frequency band is set to a constant, so as to reduce repeated calculation due to different $b_{k,p}$ in the generation of the DPD coefficient lookup table, simplify the calculation process and reduce the length of DPD coefficient. Meanwhile, a quantization factor is further provided for the DPD coefficient lookup table, in order to facilitate the realization of FPGA.

Moreover, in the embodiments of the present application, after the first frequency band pre-distortion coefficient and the second frequency band pre-distortion coefficient are calculated, the pre-distortion coefficients are further performed the phase calibration, and then the DPD coefficient lookup tables are updated according to the pre-distortion coefficients performed the phase calibration. Through the phase calibration of the pre-distortion coefficients, the phase of the arithmetic sum of the pre-distortion coefficient for each frequency band is zero, such that the phase of superimposed multi-frequency band signals has no deviation when DPD coefficient lookup tables are updated, whereby improving the accuracy of the DPD processing.

Figure 7:
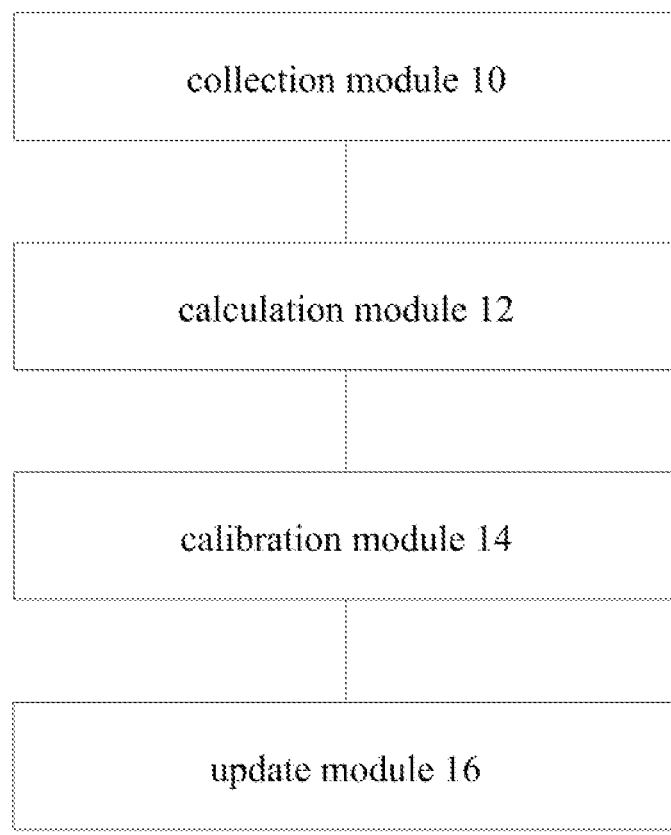
FIG. 7 is a block diagram of a system for updating multi-frequency band pre-distortion coefficient lookup table according to a third embodiment of the present application.

With reference to FIG. 7, it shows a block diagram of a system for updating multi-frequency band pre-distortion coefficient lookup table according to an embodiment of the present application. The system may particularly include: a collection module 10, a calculation module 12, a calibration module 14 and an update module 16.

Herein, the collection module 10 is configured to collect a first frequency band reference signal and a first frequency band feedback signal, and a second frequency band reference signal and a second frequency band feedback signal;

the calculation module 12 is configured to calculate a first frequency band pre-distortion coefficient and a second frequency band pre-distortion coefficient, according to the first frequency band reference signal and the first frequency band feedback signal, and the second frequency band reference signal and the second frequency band feedback signal.

The calculation module 12 may particularly comprise:

a first matrix calculation module, configured to calculate a first frequency band feedback matrix $U_1$, according to the first frequency band feedback signal and the second. frequency baud feedback signal;

wherein the first matrix calculation module may comprise:

first reference calculation sub-unit, configured to calculate a first frequency band feedback parameter $u_{km}^{(1)}(n)$:

$$u_{km}^{(1)}(n) = y_1(n-m) \sum_{k=0}^{K-1} \sum_{p=0,1,\ldots}^{\lceil k/2 \rceil} (|y_1(n-m)|^{k-2p}|y_2(n-m)|^{2p})$$

a first transpose matrix calculation sub-unit, configured to calculate a transpose matrix $u_{km}^{(1)}$ of the matrix composed of $u_{km}^{(1)}(n)$:

$$u_{km}^{(1)} = [u_{km}^{(1)}(0), \ldots, u_{km}^{(1)}(N-1)]^T$$

a first feedback matrix calculation sub-unit, configured to calculate a first frequency band feedback matrix $U_1$ composed of $u_{km}^{(1)}$:

$$U_1 = [u_{11}^{(1)}, \ldots, u_{km}^{(1)}, \ldots, u_{KM}^{(1)}]$$

wherein, $y_1(n)$ is the first frequency band feedback signal, $y_2(n)$ is the second frequency band feedback signal, $n=1, 2, \ldots, N$, and N is the signal length;

a first acquisition module, configured to acquire a reference matrix $z_1$ corresponding to the first frequency band reference signal;

a first coefficient calculation module, configured to calculate a matrix $\hat{c}_1$ composed of the first frequency band pre-distortion coefficient according to the $U_1$ and the $z_1$:

$$\hat{c}_1 = (U_1^H U_1)^{-1} U_1^H \cdot z_1;$$

wherein, $\hat{c} = [c_{1,1}^{(1)}, c_{2,1}^{(1)}, \ldots c_{k,m}^{(1)}, \ldots c_{K,M}^{(1)}]$, $c_{k,m}^{(1)}$ is the first frequency band pre-distortion coefficient;

a second matrix calculation module, configured to calculate a second frequency band feedback matrix $U_2$, according to the first frequency band feedback signal and the second frequency baud feedback signal;

wherein the second matrix calculation module may include:

a second reference calculation sub-unit, configured to calculate a second frequency band feedback parameter $u_{km}^{(2)}(n)$:

$$u_{km}^{(2)}(n) = y_2(n-m) \sum_{k=0}^{K-1} \sum_{p=0,1,\ldots}^{\lceil k/2 \rceil} (|y_2(n-m)|^{k-2p}|y_1(n-m)|^{2p})$$

a second transpose matrix calculation sub-unit, configured to calculate a transpose matrix $u_{km}^{(2)}$ of the matrix composed of $u_{km}^{(2)}(n)$:

$$u_{km}^{(2)} = [u_{km}^{(2)}(0), \ldots, u_{km}^{(2)}(N-1)]^T$$

a second feedback matrix calculation sub-unit, configured to calculate the second frequency band feedback matrix $U_2$ composed of $u_{km}^{(2)}$:

$$U_2 = [u_{11}^{(2)}, \ldots, u_{km}^{(2)}, \ldots, u_{KM}^{(2)}]$$

wherein, $y_1(n)$ is the first frequency band feedback signal, $y_2(n)$ is the second frequency band feedback signal, $n=1, 2, \ldots, N$, and N is the signal length:

a second acquisition module, configured to acquire a reference matrix $z_2$ corresponding to the second frequency band reference signal;

a second coefficient calculation module, configured to calculate a matrix $\hat{c}_2$ composed of the second frequency band pre-distortion coefficient according to the $U_2$ and the $z_2$:

$$\hat{c}_2 = (U_2^H U_2)^{-1} U_2^H \cdot z_2;$$

wherein, $\hat{c} = [c_{1,1}^{(2)}, c_{2,1}^{(2)}, \ldots c_{k,m}^{(2)}, \ldots c_{K,M}^{(2)}]$, $c_{k,m}^{(2)}$ is the second frequency band pre-distortion coefficient, $k=1, 2, \ldots, K$, $m=1, 2, \ldots, M$, K is a non-linear order, and M is the depth of memory.

A calibration module 14 is configured to perform phase calibration on the first frequency baud pre-distortion coefficient and the second frequency band pre-distortion coefficient, respectively;

The calibration module 14 may particularly include:

a first calibration factor calculation module, configured to calculate a first frequency band phase calibration factor $\theta^{(1)}$:

$$\theta^{(1)} = \text{angle}\left(\sum_{m=1}^{M-1} \sum_{k=0}^{K-1} c_{k,m}^{(1)}\right);$$

a first calibration module, configured to calculate a first frequency band pre-distortion coefficient $c'_{k,m}^{(1)}$ after the phase calibration according to $\theta^{(1)}$:

$$c'_{k,m}^{(1)} = c_{k,m}^{(1)} \cdot \exp(-j*\theta^{(1)});$$

a second calibration factor calculation module, configured to calculate a second frequency band phase calibration factor $\theta^{(2)}$:

$$\theta^{(2)} = \text{angle}\left(\sum_{m=1}^{M-1} \sum_{k=0}^{K-1} c_{k,m}^{(2)}\right);$$

a second calibration module, configured to calculate second frequency band pre-distortion coefficient $c'_{k,m}^{(2)}$ after the phase calibration according to $\theta^{(2)}$:

$$c'_{k,m}^{(2)} = c_{k,m}^{(2)} \cdot \exp(-j*\theta^{(2)}).$$

An update module 16 is configured to update a first lookup table according to the first frequency band pre-distortion coefficient performed the phase calibration, and update a second lookup table according to the second frequency band pre-distortion coefficient performed the phase calibration.

Herein, the first lookup table is a first frequency band pre-distortion coefficient lookup table, and the second lookup table is a second frequency band pre-distortion coefficient lookup table.

The update module 16 may include:

a first generation module, configured to generate a first lookup table $LUT1_m(|y_1(n-m)|, |y_2(n-m)|)$, according to the first frequency band feedback signal and the second frequency band feedback signal:

$$LUT1_m(|y_1(n-m)|,|y_2(n-m)|) = \sum_{k=0}^{K-1} c'^{(1)}_{k,m} \cdot \sum_{p=0,1,\ldots}^{k/2} (b_{k,p}|y_1(n-m)|^{k-2p}|y_2(n-m)|^{2p})$$

wherein, $b_{k,p}$ is a weighting coefficient of interaction between the first frequency band and the second frequency band. $y_1(n)$ is the first frequency band feedback signal, $y_2(n)$ is the second frequency band feedback signal, $n=1, 2, \ldots, N$, and N is the signal length;

wherein in the embodiment of the present application, the weighting coefficient $b_{k,p}$ is a constant;

a first input signal acquisition module, configured to acquire a first frequency band input signal $x_1(n)$;

a first amplitude calculation module, configured to calculate an amplitude $|x_1(n-m)|$ of the first frequency band input signal when the depth of memory is M;

a first update module, configured to, by using the amplitude $|x_1(n-m)|$ of the first frequency band input signal as an input address, store the first frequency band pre-distortion coefficient in the first lookup table in a from-small-to-large sequence according to the input address, to update the first lookup table;

a second generation module, configured to generate a second lookup table $LUT2_m(|y_2(n-m)|, |y_1(n-m)|)$, according to the first frequency band feedback signal and the second frequency band feedback signal, wherein $$LUT2_m(|y_2(n-m)|,|y_1(n-m)|) = \sum_{k=0}^{K-1} c_{k,m}^{\prime(2)} \cdot \sum_{p=0,1,...}^{k/2} (b_{k,p}|y_2(n-m)|^{k-2p}|y_1(n-m)|^{2p})$$

wherein, $b_{k,p}$ is a weighting coefficient of interaction between the first frequency band and the second frequency band, $y_1(n)$ is the first frequency band feedback signal, $y_2(n)$ is the second frequency band feedback signal, n=1, 2, ..., N, and N is the signal length;

a second input signal acquisition module, configured to acquire a second frequency band input signal $x_2(n)$;

a second amplitude calculation module, configured to calculate an amplitude $|x_2(n-m)|$ of the second frequency band input signal when the depth of memory is M;

a second update module, configured to, by using the amplitude $|x_2(n-m)|$ of the second frequency band input signal as an input address, store the second frequency band pre-distortion coefficient in the second lookup table in a from-small-to-large sequence according to the input address, to update the second lookup table.

Preferably, in the embodiment of the present application, quantization factors of the first lookup table and the second lookup table are provided, and in particular, the update module 16 may further include:

a first acquisition module, configured to, after the first lookup table is generated according to the first frequency band feedback signal and the second frequency band feedback signal, acquire a maximum value Inv of the first frequency band input signal and a maximum size $L_1$ of the first lookup table, and a maximum size $L_2$ of the second lookup table;

a first quantization factor calculation module, configured to divide the maximum value nevi by the maximum size $L_1$, and use the calculated result as a first frequency band quantization factor $\Delta_1$;

a first transformation module, configured to transform the first lookup table $LUT1_m(|y_1(n-m)|, |y_2(n-m)|)$ to $LUT1'_m(l_1\Delta_1, l_2\Delta_1)$, according, to the first frequency band quantization factor $\Delta_1$:

$$LUT1'_m(l_1\Delta_1, l_2\Delta_1) = \sum_{k=0}^{K-1} c_{k,m}^{\prime(1)} \cdot \sum_{p=0,1,...}^{k/2} (b_{k,p}(l_1\Delta_1)^{k-2p}(l_2\Delta_1)^{2p});$$

wherein, $l_1$=1, 2, ..., $L_1$, and $l_2$=1, 2, ..., $L_2$;

therefore, the first update module may store the first frequency band pre-distortion coefficient in the transformed first lookup table;

a second acquisition module, configured to, after the second lookup table is generated according to the first frequency band feedback signal and the second frequency band feedback signal, acquire a maximum value $mv_2$ of the second frequency band input signal and a maximum size $L_2$ of the second lookup table, and a maximum size $L_1$ of the first lookup table;

a second quantization factor calculation module, configured to divide the maximum value $mv_2$ by the maximum size $L_2$, and use the calculated result as a second frequency band quantization factor $\Delta_2$;

a second transformation module, configured to transform the second lookup table $LUT2_m(|y_2(n-m)|, |y_1(n-m)|)$ to $LUT2'_m(l_2\Delta_2, l_1\Delta_2)$, according to the second frequency band quantization factor $\Delta_2$, wherein $$LUT2'_m(l_2\Delta_2, l_1\Delta_2) = \sum_{k=0}^{K-1} c_{k,m}^{\prime(2)} \cdot \sum_{p=0,1,...}^{k/2} (b_{k,p}(l_2\Delta_2)^{k-2p}(l_1\Delta_2)^{2p});$$

wherein, $l_1$=1, 2, ..., $L_1$, and $l_2$=1, 2, ..., $L_2$;

therefore, the second update module may store the second frequency band pre-distortion coefficient in the transformed second lookup table.

According to the embodiment of the present application, when the system for updating the multi-frequency band pre-distortion coefficient lookup table updates the DPD coefficient lookup table of a frequency band a feedback signal of another frequency band may be introduced, such that the update process of the DPD coefficient lookup table takes into account the interaction of signals of two frequency bands and the calculated DPD coefficient is more accurate.

Secondly, in the calculation process of the embodiment of the present application, the weighting coefficient $b_{k,p}$ of interaction between the first frequency band and the second frequency band is set to a constant, so as to reduce repeated calculation due to different $b_{k,p}$ in the generation of the DPD coefficient lookup table, simplify the calculation process and reduce the length of DPD coefficient. Meanwhile, a quantization factor is further provided for the DPD coefficient lookup table, in order to facilitate the realization of FPGA.

Moreover, in the embodiment of the present application, after the first frequency band pre-distortion coefficient and the second frequency band pre-distortion coefficient are calculated, the pre-distortion coefficients are further performed the phase calibration, and then the DPD coefficient lookup tables are updated according to the pre-distortion coefficients performed the phase calibration. Through the phase calibration of the pre-distortion coefficients, the phase of the arithmetic sum of the pre-distortion coefficient for each frequency band is zero, such that the phase of superimposed multi-frequency band signals has no deviation when DPD coefficient lookup tables are updated, whereby improving the accuracy of the DPD processing.

Since the above system embodiment is substantially similar to the method embodiments, the description thereof is relatively brief. As for the related parts thereof, reference may be made to the corresponding description of the method embodiments.

The various embodiments in the specification have been explained step by step. Each of the embodiments has only emphasized the differences from others, and the same or similar parts between embodiments could be made reference to each other.

Based on the above description, the present application also provides a computer readable recording medium in which a program for executing the method for updating multi-frequency band pre-distortion coefficient lookup table is recorded. Wherein, the detailed content of the method for updating multi-frequency band pre-distortion coefficient lookup table could refer to that of the method embodiments, the description of which will be omitted herein.

The computer readable recording medium may comprise any mechanism for storing or transmitting information in a computing device (e.g., a computer) readable form. For example, the machine readable medium includes Read Only Memory (ROM), Random Access Memory (RAM), magnetic disk storage medium, optical storage medium, flash. memory medium, and propagation signals (e.g., carrier wave, infrared signals, digital signals, etc.) in the forms of electrics, optics, acoustics or any other forms.

The present application can be described in general context of a computer executable instruction which is executed by a computer, such as a program module. Generally, the program module may include routine, program, object, component, data structure and the like which can perform particular tasks or implement particular abstract data types. The present application e can also be practiced in distributed computing environments. In such a distributed computing environment, the program module can be connected to a remote processing device through a communication network to perform the task. In the distributed computing environment, the program module may be located in local and remote computer storage medium including a memory device.

For the briefly descriptive purpose, the method embodiments as described above are represented as a combination of a series of actions, however, it should be understood by a person skill in the art, the present application is not restricted by the sequence of the actions. This is because some of steps may be performed in other sequence or simultaneously according to the present application. Secondly, it also should be understood by the person skill in the art, the embodiments described in the specification are the preferred embodiments, and thus the actions and modules involved in the present application are not necessarily required.

In the end, it will be explained that, the terms "first", "second", etc. are only used herein to distinguish one element or operation from another one, and does not necessarily require or suggest that there are any actual relationship or sequence between these elements or operations. Further, the tennis "comprise", "include" and any other variants thereof are intended to cover a non-exclusive "comprise", so that process, method, product or equipment which includes a series of elements may include not only those elements, but also other elements that do not be definitely listed, or also may include the inherent elements of the process, method, product or equipment. In the absence of more restrictions, an element defined by the statement "includes a . . . " does not mean to exclude other same elements in the process, method, product or equipment including this element.

Described above are the method and the system for updating multi-frequency band pre-distortion coefficient lookup table according to the present application. Herein the principles and implementation manners of the present application are illustrated by way of specific examples. The embodiments described above are only intended to help understand the method and main concept of the present application. Meanwhile, for an ordinary skilled person in the art, variations could be made to the specific embodiments and their application scope in accordance with the concept of the present application. In summary, the disclosure of the specification should not be construed as limiting of the present application.

The invention claimed is:

1. A method for updating multi-frequency band pre-distortion coefficient lookup table, comprising:
collecting a first frequency band reference signal and a first frequency band feedback signal, and a second frequency band reference signal and a second frequency band feedback signal;
calculating a first frequency band pre-distortion coefficient and a second frequency band pre-distortion coefficient, according to the first frequency band reference signal and the first frequency band feedback signal, and the second frequency band reference signal and the second frequency band feedback signal;
performing phase calibration on the first frequency band pre-distortion coefficient and the second frequency band pre-distortion coefficient, respectively;
updating a first lookup table according to the first frequency band pre-distortion coefficient performed the phase calibration, and updating a second lookup table according to the second frequency band pre-distortion coefficient performed the phase calibration;
wherein, the first lookup table is a first frequency band pre-distortion coefficient lookup table, and the second lookup table is a second frequency band pre-distortion coefficient lookup table.

2. The method according to claim 1, wherein,
the step of calculating the first frequency band pre-distortion coefficient, comprises:
calculating a first frequency band feedback matrix $U_1$, according to the first frequency band feedback signal and the second frequency band feedback signal;
acquiring a reference matrix $z_1$ corresponding to the first frequency band reference signal;
calculating a matrix $\hat{c}_1$ composed of the first frequency band pre-distortion coefficient according to the $U_1$ and the $z_1$:

$$\hat{c}_1 = (U_1^H U_1)^{-1} U_1^H \cdot z_1;$$

wherein, $\hat{c}_1 = [c_{1,1}^{(1)}, c_{2,1}^{(1)}, \ldots c_{k,m}^{(1)}, \ldots c_{K,M}^{(1)}]$, $c_{k,m}^{(1)}$ is the first frequency band pre-distortion coefficient;
the step of calculating the second frequency band pre-distortion coefficient, comprises:
calculating a second frequency band feedback matrix $U_2$, according to the first frequency band feedback signal and the second frequency band feedback signal;
acquiring a reference matrix $z_2$ corresponding to the second frequency band reference signal,
calculating a matrix $\hat{c}_2$ composed of the second frequency band pre-distortion coefficient according to the $U_2$ and the $z_2$:

$$\hat{c}_2 = (U_2^H U_2)^{-1} U_2^H \cdot z_2;$$

wherein, $\hat{c}_2 = [c_{1,1}^{(2)}, c_{2,1}^{(2)}, \ldots c_{k,m}^{(2)}, \ldots c_{K,M}^{(2)}]$, $c_{k,m}^{(2)}$ is the second frequency band pre-distortion coefficient, $k=1, 2, \ldots, K$, $m=1, 2, \ldots, M$, K is a non-linear order, and M is the depth of memory.

3. The method according to claim 2, wherein the step of calculating the first frequency band feedback matrix $U_1$ according to the first frequency band feedback signal and the second frequency band feedback signal, comprises:
calculating a first frequency band feedback parameter $u_{km}^{(1)}(n)$:

$$u_{km}^{(1)}(n) = y_1(n-m) \sum_{k=0}^{K-1} \sum_{p=0,1,\ldots}^{[k/2]} (|y_1(n-m)|^{k-2p} |y_2(n-m)|^{2p})$$

calculating, a transpose matrix $u_{km}^{(1)}$ of the matrix composed of $u_{km}^{(1)}(n)$:

$$u_{km}^{(1)}=[u_{km}^{(1)}(0),\ldots,u_{km}^{(1)}(N-1)]^T$$

calculating the first frequency band feedback matrix $U_1$ composed of the $u_{km}^{(1)}$:

$$U_1=[u_{11}^{(1)},\ldots,u_{km}^{(1)},\ldots,u_{KM}^{(1)}]$$

wherein, $y_1(n)$ is the first frequency band feedback signal, $y_2(n)$ is the second frequency band feedback signal, $n=1, 2, \ldots, N$, and N is signal length.

4. The method according to claim 2, wherein the step of calculating the second frequency band feedback matrix $U_2$ according to the first frequency band feedback signal and the second frequency band feedback signal, comprises:

calculating a second frequency band feedback parameter $u_{km}^{(2)}(n)$:

$$u_{km}^{(2)}(n) = y_2(n-m)\sum_{k=0}^{K-1}\sum_{p=0,1,\ldots}^{[k/2]} (|y_2(n-m)|^{k-2p}|y_1(n-m)|^{2p})$$

calculating a transpose matrix $u_{km}^{(2)}$ of the matrix composed of $u_{km}^{(2)}(n)$:

$$u_{km}^{(2)}=[u_{km}^{(2)}(0),\ldots,u_{km}^{(2)}(N-1)]^T$$

calculating the second frequency band feedback matrix $U_2$ composed of $u_{km}^{(2)}$:

$$U_2=[u_{11}^{(2)},\ldots,u_{km}^{(2)},\ldots,u_{KM}^{(2)}]$$

wherein, $y_1(n)$ is the first frequency band feedback signal, $y_2(n)$ is the second frequency band feedback signal, $n=1, 2, \ldots, N$ and N is signal length.

5. The method according to claim 2, wherein
the step of performing the phase calibration on the first frequency band pre-distortion coefficient, comprises:
calculating a first frequency band phase calibration factor $\theta^{(1)}$:

$$\theta^{(1)} = \text{angle}\left(\sum_{m=1}^{M-1}\sum_{k=0}^{K-1} c_{k,m}^{(1)}\right);$$

calculating a first frequency band pre-distortion coefficient $c_{k,m}'^{(1)}$ after the phase calibration according to $\theta^{(1)}$:

$$c_{k,m}'^{(1)}=c_{k,m}^{(1)}\cdot\exp(-j*\theta^{(1)});$$

the step of performing the phase calibration on the second frequency band pre-distortion coefficient comprises:
calculating a second frequency baud phase calibration factor $\theta^{(2)}$:

$$\theta^{(2)} = \text{angle}\left(\sum_{m=1}^{M-1}\sum_{k=0}^{K-1} c_{k,m}^{(2)}\right);$$

calculating a second frequency band pre-distortion coefficient $c_{k,m}'^{(2)}$ after the phase calibration according to $\theta^{(2)}$:

$$c_{k,m}'^{(2)}=c_{k,m}^{(2)}\cdot\exp(-j*\theta^{(2)}).$$

6. The method according to claim 5, wherein the step of updating a first lookup table according to the first frequency band pre-distortion coefficient performed the phase calibration, comprises:

generating a first lookup table $LUT1_m(|y_1(n-m)|, |y_2(n-m)|)$, according to the first frequency band feedback signal and the second frequency band feedback signal:

$$LUT1_m(|y_1(n-m)|,|y_2(n-m)|) = \sum_{k=0}^{K-1} c_{k,m}'^{(1)}\cdot\sum_{p=0,1,\ldots}^{k/2}(b_{k,p}|y_1(n-m)|^{k-2p}|y_2(n-m)|^{2p})$$

wherein, $b_{k,p}$ is a weighting coefficient of interaction between the first frequency band and the second frequency band, $y_1(n)$ is the first frequency band feedback signal, $y_2(n)$ is the second frequency band feedback signal, $n=1, 2, \ldots, N$, and N is signal length;

acquiring a first frequency band input signal $x_1(n)$;

calculating an amplitude $|x_1(n-m)|$ of the first frequency band input signal when the depth of memory is M;

by using the amplitude $|x_1(n-m)|$ of the first frequency band input signal as an input address, storing the first frequency band pre-distortion coefficient in the first lookup table in a from-small-to-large sequence according to the input address, to update the first lookup table.

7. The method according to claim 6, wherein after generating the first lookup table according to the first frequency band feedback signal and the second frequency band feedback signal, the method further comprises:

acquiring a maximum value $mv_1$ of the first frequency band input signal and a maximum size $L_1$ of the first lookup table, and a maximum size $L_2$ of the second lookup table;

dividing the maximum value $mv_1$ by the maximum size $L_1$, and using the calculated result as a first frequency band quantization factor $\Delta_1$;

transforming the first lookup table $LUT1_m(|y_1(n-m)|, |y_2(n-m)|)$ to $LUT1_m'(l_1\Delta_1, l_2\Delta_1)$, according to the first frequency band quantization factor $\Delta_1$:

$$LUT1_m'(l_1\Delta_1, l_2\Delta_1) = \sum_{k=0}^{K-1} c_{k,m}'^{(1)}\cdot\sum_{p=0,1,\ldots}^{k/2}(b_{k,p}(l_1\Delta_1)^{k-2p}(l_2\Delta_1)^{2p});$$

wherein, $l_1=1, 2, \ldots, L_1$, and $l_2=1, 2, \ldots, L_2$;

the step of storing the first frequency band pre-distortion coefficient in the first lookup table, comprises:

storing the first frequency band pre-distortion coefficient in the transformed first lookup table.

8. The method according to claim 6, wherein the weighting coefficient $b_{k,p}$ is a constant.

9. The method according to claim 5, wherein the step of updating a second lookup table according to the second frequency band pre-distortion coefficient performed the phase calibration, comprises:

generating a second lookup table $LUT2_m(|y_2(n-m)|, |y_1(n-m)|)$, according to the first frequency band feedback signal and the second frequency band feedback signal, wherein $$LUT2_m(|y_2(n-m)|,|y_1(n-m)|) = \sum_{k=0}^{K-1} c_{k,m}'^{(2)}\cdot\sum_{p=0,1,\ldots}^{k/2}(b_{k,p}|y_2(n-m)|^{k-2p}|y_1(n-m)|^{2p})$$

wherein, $b_{k,p}$ is a weighting coefficient of interaction between the first frequency band and the second frequency band, $y_1(n)$ is the first frequency band feedback signal, $y_2(n)$ is the second frequency band feedback signal, $n=1, 2, \ldots, N$, and N is signal length;

acquiring a second frequency band input signal $x_2(n)$;

calculating an amplitude $|x_2(n-m)|$ of the second frequency band input signal when the depth of memory is M;

by using the amplitude $|x_2(n-m)|$ of the second frequency band input signal as an input address, storing the second frequency band pre-distortion coefficient in the second lookup table in a from-small-to-large sequence according to the input address, to update the second lookup table.

10. The method according to claim 9, wherein after generating the second lookup table according to the first frequency band feedback signal and the second frequency band feedback signal, the method further comprises:

acquiring a maximum value $mv_2$ of the second frequency band input signal and a maximum size $L_2$ of the second lookup table, and a maximum size $L_1$ of the first lookup table;

dividing the maximum value $mv_2$ by the maximum size $L_2$, and using the calculated result as a second frequency band quantization factor $\Delta_2$;

transforming the second lookup table $LUT2_m(|y_2(n-m)|, |y_1(n-m)|)$ to $LUT2_m'(l_2\Delta_2, l_1\Delta_2)$, according to the second frequency band quantization factor, wherein $$LUT2'_m(l_2\Delta_2, l_1\Delta_2) = \sum_{k=0}^{K-1} c_{k,m}^{'(2)} \cdot \sum_{p=0,1,\ldots}^{k/2} (b_{k,p}(l_2\Delta_2)^{k-2p}(l_1\Delta_2)^{2p});$$

wherein, $l_1 = 1, 2, \ldots, L_1$, and $l_2 = 1, 2, \ldots, L_2$;

the step of storing the second frequency band pre-distortion coefficient in the second lookup table comprises:

storing the second frequency band pre-distortion coefficient in the transformed second lookup table.

11. The method according to claim 9, wherein the weight coefficient $b_{k,p}$ is a constant.

12. A non-transitory computer readable recording medium in which a program for executing the method according to claim 1 is recorded.

13. A system for updating multi-frequency band pre-distortion coefficient lookup table, comprising:

a collection module, configured to collect a first frequency band reference signal and a first frequency band feedback signal, and a second frequency band reference signal and a second frequency band feedback signal;

a calculation module, configured to calculate a first frequency band pre-distortion coefficient and a second frequency band pre-distortion coefficient, according to the first frequency band reference signal and the first frequency band feedback signal, and the second frequency band reference signal and the second frequency band feedback signal;

a calibration module, configured to perform phase-calibration on the first frequency band pre-distortion coefficient and the second frequency band pre-distortion coefficient, respectively;

an update module, configured to update a first lookup table according to the first frequency band pre-distortion coefficient performed the phase calibration, and update a second lookup table according to the second frequency band pre-distortion coefficient performed the phase calibration: wherein, the first lookup table is a first frequency band pre-distortion coefficient lookup table, and the second lookup table is a second frequency band pre-distortion coefficient lookup table.

14. The system according to claim 13, wherein the calculation module comprises:

a first matrix calculation module, configured to calculate a first frequency band feedback matrix $U_1$, according to the first frequency band feedback signal and the second frequency band feedback signal;

a first acquisition module, configured to acquire a reference matrix $z_1$ corresponding to the first frequency band reference signal;

a first coefficient calculation module, configured to calculate a matrix $\hat{c}_1$ composed of the first frequency band pre-distortion coefficient according to the $U_1$ and the $z_1$;

$$\hat{c}_1 = (U_1^H U_1)^{-1} U_1^H z_1;$$

wherein, $\hat{c}_1 = [c_{1,1}^{(1)}, c_{2,1}^{(1)}, \ldots c_{k,m}^{(1)}, \ldots c_{K,M}^{(1)}]$, $c_{k,m}^{(1)}$ is the first frequency band pre-distortion coefficient;

a second matrix calculation module, configured to calculate a second frequency band feedback matrix $U_2$, according to the first frequency band feedback signal and the second frequency band feedback signal;

a second acquisition module, configured to acquire a reference matrix $z_2$ corresponding to the second frequency band reference signal;

a second coefficient calculation module, configured to calculate a matrix $\hat{c}_2$ composed of the second frequency band pre-distortion coefficient according to the $U_2$ and the $z_2$:

$$\hat{c}_2 = (U_2^H U_2)^{-1} U_2^H z_2;$$

wherein, $\hat{c}_2 = [c_{1,1}^{(2)}, c_{2,1}^{(2)}, \ldots c_{k,m}^{(2)}, \ldots c_{K,M}^{(2)}]$, $c_{k,m}^{(2)}$ the second frequency band pre-distortion coefficient, $k = 1, 2, \ldots, K$, $m = 1, 2, \ldots, M$, K is a non-linear order, and M is the depth of memory.

15. The system according to claim 14, wherein the first matrix calculation module comprises:

a first reference calculation sub-unit, configured to calculate a first frequency band feedback parameter $u_{km}^{(1)}$:

$$u_{km}^{(1)}(n) = y_1(n-m) \sum_{k=0}^{K-1} \sum_{p=0,1,\ldots}^{[k/2]} (|y_1(n-m)|^{k-2p}|y_2(n-m)|^{2p})$$

a first transpose matrix calculation sub-unit, configured to calculate a transpose matrix $u_{km}^{(1)}$ of the matrix composed of $u_{km}^{(1)}(n)$:

$$u_{km}^{(1)} = [u_{km}^{(1)}(0), \ldots, u_{km}^{(1)}(N-1)]^T$$

a first feedback matrix calculation sub-unit, configured to calculate a first frequency band feedback matrix $U_1$ composed of $u_{km}^{(1)}$:

$$U_1 = [u_{11}^{(1)}, \ldots, u_{km}^{(1)}, \ldots, u_{KM}^{(1)}]$$

wherein, $y_1(n)$ is the first frequency band feedback signal, $y_2(n)$ is the second frequency band feedback signal, $n = 1, 2, \ldots, N$, and N is signal length;

the second matrix calculation module comprises:

a second reference calculation sub-unit, configured to calculate a second frequency band feedback parameter $u_{km}^{(2)}(n)$:

$$u_{km}^{(2)}(n) = y_2(n-m) \sum_{k=0}^{K-1} \sum_{p=0,1,\ldots}^{[k/2]} (|y_2(n-m)|^{k-2p}|y_1(n-m)|^{2p})$$

a second transpose matrix calculation sub-unit, configured to calculate a transpose matrix $u_{km}^{(2)}$ of the matrix composed of $u_{km}^{(2)}(n)$:

$$u_{km}^{(2)} = [u_{km}^{(2)}(0), \ldots, u_{km}^{(2)}(N-1)]^T$$

a second feedback matrix calculation sub-unit, configured to calculate the second frequency band feedback matrix $U_2$ composed of $u_{km}^{(2)}$:

$$U_2 = [u_{11}^{(2)}, \ldots, u_{km}^{(2)}, \ldots, u_{KM}^{(2)}]$$

wherein, $y_1(n)$ is the first frequency band feedback signal, $y_2(n)$ is the second frequency band feedback signal, $n=1, 2, \ldots, N$, and N is signal length.

16. The system according to claim 14, wherein the calibration module comprises:

a first calibration factor calculation module, configured to calculate a first frequency band phase calibration factor $\theta^{(1)}$:

$$\theta^{(1)} = \text{angle}\left(\sum_{m=1}^{M-1}\sum_{k=0}^{K-1} c_{k,m}^{(1)}\right);$$

a first calibration module, configured to calculate a first frequency band pre-distortion coefficient $c_{k,m}'^{(1)}$ after the phase calibration according to $\theta^{(1)}$:

$$c_{k,m}'^{(1)} = c_{k,m}^{(1)} \cdot \exp(-j*\theta^{(1)});$$

a second calibration factor calculation module, configured to calculate a second frequency band phase calibration factor $\theta^{(2)}$:

$$\theta^{(2)} = \text{angle}\left(\sum_{m=1}^{M-1}\sum_{k=0}^{K-1} c_{k,m}^{(2)}\right);$$

a second calibration module, configured to calculate a second frequency band pre-distortion coefficient $c_{k,m}'^{(2)}$ after the phase calibration according to $\theta^{(2)}$:

$$c_{k,m}'^{(2)} = c_{k,m}^{(2)} \cdot \exp(-j*\theta^{(2)}).$$

17. The method according to claim 16, wherein the update module comprises:

a first generation module, configured to generate a first lookup table $LUT1_m(|y_1(n-m)|, |y_2(n-m)|)$, according to the first frequency band feedback signal and the second frequency band feedback signal:

$$LUT1_m(|y_1(n-m)|, |y_2(n-m)|) = \sum_{k=0}^{K-1} c_{k,m}'^{(1)} \cdot \sum_{p=0,1,\ldots}^{k/2} (b_{k,p}|y_1(n-m)|^{k-2p}|y_2(n-m)|^{2p})$$

wherein, $b_{k,p}$ is a weighting coefficient of interaction between the first frequency band and the second frequency band, $y_1(n)$ is the first frequency band feedback signal, $y_2(n)$ is the second frequency band feedback signal, $n=1, 2, \ldots, N$, and N is signal length;

a first input signal acquisition module, configured to acquire a first frequency band input signal $x_1(n)$;

a first amplitude calculation module, configured to calculate an amplitude $|x_1(n-m)|$ of the first frequency band input signal when the depth of memory is M;

a first update module, configured to, by using the amplitude $|x_1(n-m)|$ of the first frequency band input signal as an input address, store the first frequency band pre-distortion coefficient in the first lookup table in a from-small-to-large sequence according to the input address, to update the first lookup table;

a second generation module, configured to generate a second lookup table $LUT2_m(|y_2(n-m)|, |y_1(n-m)|)$, according to the first frequency band feedback signal and the second frequency band feedback signal, wherein $$LUT2_m(|y_2(n-m)|, |y_1(n-m)|) = \sum_{k=0}^{K-1} c_{k,m}'^{(2)} \cdot \sum_{p=0,1,\ldots}^{k/2} (b_{k,p}|y_2(n-m)|^{k-2p}|y_1(n-m)|^{2p})$$

wherein, $b_{k,p}$ is a weighting coefficient of interaction between the first frequency band and the second frequency band, $y_1(n)$ is the first frequency band feedback signal, $y_2(n)$ is the second frequency band feedback signal, $n=1, 2, \ldots, N$, and N is signal length;

a second input signal acquisition module, configured to acquire a second frequency band input signal $x_2(n)$;

a second amplitude calculation module, configured to calculate an amplitude $|x_2(n-m)|$ of the second frequency band input signal when the depth of memory is M;

a second update module, configured to, by using the amplitude of the second frequency band input signal as an input address, store the second frequency band pre-distortion coefficient in the second lookup table in a from-small-to-large sequence according to the input address, to update the second lookup table.

18. The system according to claim 17, wherein the weighting coefficient $b_{k,p}$ is a constant.

* * * * *